(12) United States Patent
Strzelecki et al.

(10) Patent No.: US 9,647,671 B2
(45) Date of Patent: May 9, 2017

(54) HIGH PERFORMANCE PHASE FREQUENCY DETECTORS

(71) Applicant: Wright State University, Dayton, OH (US)

(72) Inventors: Joseph Strzelecki, Fairborn, OH (US); Saiyu Ren, Beavercreek, OH (US)

(73) Assignee: Wright State University, Dayton, OH (US)

( * ) Notice: Subject to any disclaimer, the term of this patent is extended or adjusted under 35 U.S.C. 154(b) by 0 days.

(21) Appl. No.: 14/987,171

(22) Filed: Jan. 4, 2016

(65) Prior Publication Data

US 2016/0218724 A1 Jul. 28, 2016

Related U.S. Application Data

(60) Provisional application No. 62/106,461, filed on Jan. 22, 2015.

(51) Int. Cl.
| | |
|---|---|
| *H03L 7/091* | (2006.01) |
| *H03K 5/135* | (2006.01) |
| *H03L 7/089* | (2006.01) |
| *H03L 7/18* | (2006.01) |
| *H03K 3/356* | (2006.01) |

(52) U.S. Cl.
CPC ............ *H03L 7/091* (2013.01); *H03K 5/135* (2013.01); *H03L 7/0891* (2013.01); *H03L 7/18* (2013.01); *H03K 3/356104* (2013.01)

(58) Field of Classification Search
CPC . H03L 7/08; H03L 7/085; H03L 7/089; H03L 7/091; H03L 7/10; H03L 7/113; H03L 7/18; H03K 5/135; H03K 7/08; H03K 3/012; H03K 21/023; H03K 5/131; H03K 5/14; H03K 5/159; H03K 5/19; H03K 5/26
USPC ................................ 327/2, 3, 5, 7, 156, 158
See application file for complete search history.

(56) References Cited

U.S. PATENT DOCUMENTS

| | | | | |
|---|---|---|---|---|
| 3,810,233 | A | * 5/1974 | Besenfelder | G11B 5/09 360/42 |
| 4,057,741 | A | 11/1977 | Piguet | |
| 4,422,176 | A | 12/1983 | Summers | |
| 5,652,531 | A | * 7/1997 | Co | H04L 7/033 327/12 |
| 5,748,522 | A | 5/1998 | Piguet et al. | |
| 6,157,218 | A | 12/2000 | Chen | |
| 6,323,709 | B1 | 11/2001 | Kulkarni et al. | |
| 6,614,314 | B2 | 9/2003 | d'Haene et al. | |
| 7,003,065 | B2 | * 2/2006 | Homol | H03L 7/199 327/10 |

(Continued)

OTHER PUBLICATIONS

Majeed, et al., A Novel Phase Frequency Detector for a High Frequency PLL Design, Science Direct, www.sciencedirect.com, Procedia Engineering vol. 64 (2013) pp. 377-384, Elsevier Ltd., India.

(Continued)

*Primary Examiner* — John Poos
(74) *Attorney, Agent, or Firm* — Dinsmore & Shohl LLP

(57) ABSTRACT

A phase frequency detector with two stages of operation; each stage containing two D flip-flops. Each D flip-flop is interconnected to eliminate detection dead zone while avoiding glitches and incorrect output conditions for fast phase locked loop convergence and wide-band applications.

20 Claims, 19 Drawing Sheets

(56) References Cited

U.S. PATENT DOCUMENTS

| | | |
|---|---|---|
| 7,202,707 B2 | 4/2007 | Momtaz |
| 7,755,397 B2 * | 7/2010 | El-Kik .................. G01R 25/005 327/10 |
| 8,604,855 B2 | 12/2013 | Dally et al. |
| 2012/0098570 A1 | 4/2012 | Wang et al. |
| 2012/0313715 A1 | 12/2012 | Kargar et al. |

OTHER PUBLICATIONS

Lee, et al., A CMOS Phase Frequency Detector for Charge Pump Phase-Locked Loop, 1999 IEEE, pp. 601-604, Singapore.

Ismail, et al., CMOS Phase Frequency Detector for High Speed Applications, 2009 International Conference on Microelectronics, 2009 IEEE, pp. 201-204, Malaysia.

Majeed, et al., Low Power, High Frequency, Free Dead Zone PFD for a PLL Design, 2013 IEEE, Indian Institute of Information Technology Design and Manufacturing, 4 pages, India.

Sabbagh, Mhd Zaher, Thesis 0.18um Phase/Frequency Detector and Charge Pump Design for Digital Video Broadcasting for Handheld's Phase-Locked-Loop Systems, The Ohio State University 2007, pp. i-viii, pp. 1-36, USA.

* cited by examiner

HIGH PERFORMANCE PHASE FREQUENCY DETECTORS

CROSS REFERENCE TO RELATED APPLICATIONS

The present application hereby claims the benefit of Provisional U.S. Application No. 62/106,461 filed Jan. 22, 2015, titled "High Performance Phase Frequency Detectors."

TECHNICAL FIELD

The present specification generally relates to frequency detectors and, more specifically, to phase frequency detectors.

BACKGROUND

Phase frequency detectors (PFDs) are digital circuits that can measure the difference in phase between two periodic signals. PFDs can be designed for the operation of synchronous logic on integrated circuits. For example, phase locked loops (PLLs) can include PFDs that generate stable clock signals and are responsible for controlling the timing and operation of entire chips. However, common PFD design architectures suffer from performance limitations. The performance limitations can include low resolution, dead zones, narrow input range, simultaneous up signal and down signal outputs, non-linear output pulse width response, low operating frequency, and an inability to drive high-capacitive loads. Accordingly, a need exists for alternative PFDs.

SUMMARY

In one embodiment, a phase frequency detector includes a reference signal input, a clock signal input, an up signal output, a down signal output, a first D flip-flop, a second D flip-flop, a third D flip-flop, and a fourth D flip-flop. Each of the first D flip-flop, the second D flip-flop, the third D flip-flop, and the fourth D flip-flop includes a D input, a clock input, an active-low reset input, and a Q output. The Q output of the first D flip-flop is connected to the up signal output and the Q output of the second D flip-flop is connected to the down signal output. The reference signal input is connected to the clock input of the third D flip-flop and the clock signal input is connected to the clock input of the fourth D flip-flop. The Q output of the third D flip-flop is connected to the clock input of the first D flip-flop. The active-low reset input of the second D flip-flop. The Q output of the fourth D flip-flop is connected to the clock input of the second D flip-flop and the active-low reset input of the first D flip-flop. The third D flip-flop outputs a reference pulse on the Q output of the third D flip-flop in response to a reference signal provided by the reference signal input and the fourth D flip-flop outputs a clock pulse on the Q output of the fourth D flip-flop in response to a clock signal provided by the clock signal input.

In another embodiment, a fast converging phase frequency detector comprising a reference signal input, a clock signal input, an up signal output, a down signal output, a first D flip-flop, a second D flip-flop, a third D flip-flop, a fourth D flip-flop a first inverter, a second inverter, a third inverter, a fourth inverter, a seventh inverter, an eighth inverter, a ninth inverter, a tenth inverter, a first delay buffer, a second delay buffer, a first NOR gate, a second NOR gate, a third NOR gate, a fourth NOR gate, a first intra-stage feedback path, a second intra-stage feedback path, a first inter-stage feedback path, and a second inter-stage feedback path. Each of the first D flip-flop, the second D flip-flop, the third D flip-flop, and the fourth D flip-flop comprises a D input, a clock input, an active-low reset input, an active-low clock input, and a Q output. The Q output of the first D flip-flop is connected to the up signal output. The Q output of the second D flip-flop is connected to the down signal output. The reference signal input is connected to the clock input of the third D flip-flop and the clock signal input is connected to the clock input of the fourth D flip-flop. The Q output of the third D flip-flop is connected to the clock input of the first D flip-flop and the active-low reset input of the second D flip-flop. The Q output of the fourth D flip-flop is connected to the clock input of the second D flip-flop and the active-low reset input of the first D flip-flop. The third D flip-flop outputs a reference pulse on the Q output of the third D flip-flop in response to a reference signal provided by the reference signal. The fourth D flip-flop outputs a clock pulse on the Q output of the fourth D flip-flop in response to a clock signal provided by the reference signal. The reference signal input is connected to the input of a first delay buffer. The output of the first delay buffer is connected to the active-low reset input of the third D flip-flop and the reference signal input is connected to the input of the third inverter. The output of the third inverter is connected to the active-low clock input of the third D flip-flop. The clock signal input is connected to the input of the second delay buffer and the output of the second delay buffer is connected to the active-low reset input of the fourth D flip-flop. The clock signal input is connected to the input of the fourth inverter and the output of the fourth inverter is connected to the active-low clock input of the fourth D flip-flop. The output of the first inverter is connected to the active-low clock input of the first D flip-flop. The Q output of the fourth D flip-flop is connected to the input of the second inverter and the output of the second inverter is connected to the active-low clock input of the second D flip-flop. The first intra-stage feedback path is the connection of the Q output of the first D flip-flop to an input of the first NOR gate and the second NOR gate. The Q output of the fourth D flip-flop is connected to the input of the first NOR gate and the output of the first NOR gate is connected to the D input of the first D flip-flop. The second intra-stage feedback path is the connection of the Q output of the second D flip-flop to an input of first NOR gate and second NOR gate. The output of the second NOR gate is connected to the D input of the second D flip-flop. The Q output of the fourth D flip-flop and either a ground or a common reference voltage is connected to the input of the third NOR gate. The output of the third NOR gate is connected to the active-low reset input of the first D flip-flop and the Q output of the third D flip-flop and either a ground or a common reference voltage are connected to the input of the fourth NOR gate. The output of the fourth NOR gate is connected to the active-low reset input of the second D flip-flop. The Q output of the first D flip-flop is connected to the input of the seventh inverter and the output of seventh inverter is connected to the input of the eighth inverter. The output of eighth inverter is connected to the up signal output. The Q output of the second D flip-flop is connected to the input of ninth inverter and the output of ninth inverter is connected to the input of tenth inverter. The output of tenth inverter is connected to the down signal output. The first inter-stage feedback path comprises a first feedback inverter and a second feedback inverter and the second inter-stage feedback path comprises a third feedback inverter and a fourth feedback inverter. The output of the seventh inverter is connected to the input of the first feedback inverter and the output of the first feedback inverter is connected to the input of the second feedback inverter. The output of the second feedback inverter is connected to the D input of the third flip-flop. The output of the ninth inverter is connected to the input of the third feedback inverter and the output of the third feedback inverter is connected to the input of the fourth feedback inverter. And finally, the output of the fourth feedback inverter is connected to the D input of the fourth flip-flop.

In yet another embodiment, a phase lock loop control system may include, a signal input, a signal output, a charge pump and low-pass filter circuit, a variable-controlled oscillator, a frequency divider, and a feedback path. The phase frequency detector comprises a reference signal input, a clock signal input, a first D flip-flop, a second D flip-flop, a third D flip-flop, a fourth D flip-flop and a phase frequency detector output comprising an up signal output and a down signal output. Each of the first D flip-flop, the second D flip-flop, the third D flip-flop, and the fourth D flip-flop comprises a D input, a clock input, an active-low reset input, and a Q output. The Q output of the first D flip-flop is connected to the up signal output. The Q output of the second D flip-flop is connected to the down signal output. The reference signal input is connected to the clock input of the third D flip-flop and the clock signal input is connected to the clock input of the fourth D flip-flop. The Q output of the third D flip-flop is connected to the clock input of the first D flip-flop and the active-low reset input of the second D flip-flop and the Q output of the fourth D flip-flop is connected to the clock input of the second D flip-flop and the active-low reset input of the first D flip-flop. The third D flip-flop outputs a reference pulse on the Q output of the third D flip-flop in response to a reference signal provided by the reference input, and the fourth D flip-flop outputs a clock pulse on the Q output of the fourth D flip-flop in response to a clock signal provided by the clock input. The charge pump and low-pass filter circuit comprises a charge input and a charge output and the voltage-controlled oscillator comprises a voltage input and a voltage output. The signal input is connected to the reference signal input of the phase frequency detector and the phase frequency detector output is connected to the charge input of the charge pump & low-pass filter circuit. The charge output of the charge pump & low-pass filter circuit is connected to the voltage input of the voltage-controlled oscillator. The voltage output of the voltage-controlled oscillator is connected to the signal output and the feedback path is connected to the clock signal input of the phase frequency detector. The feedback path comprises a frequency divider.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
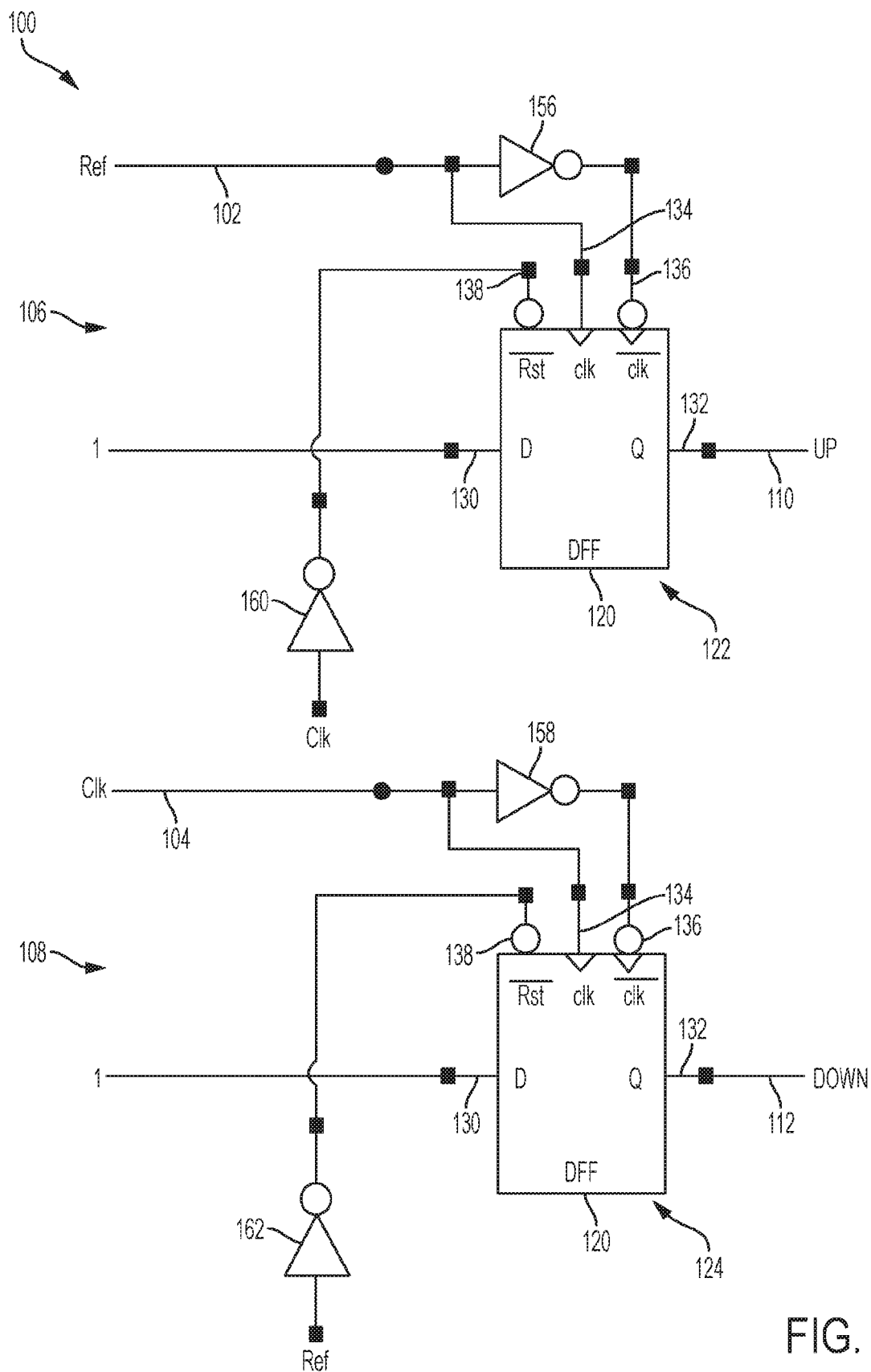
FIG. 1 schematically depicts a phase frequency detector (PFD) according to one or more embodiments shown and described herein.

Referring now to FIG. 1, an embodiment of a phase frequency detector (PFD) 100 is schematically depicted. Generally, the PFD 100 can be formed from digital circuit components that are arranged to measure the difference in phase between two periodic signal inputs. Specifically, the PFD 100 can be configured to receive two periodic input signals via a reference signal input 102 and a clock signal input 104. It is noted that, while the inputs are described herein as the reference signal input 102 and the clock signal input 104 for clarity, designation of the input signals is arbitrary. Accordingly, the PFD 100 can receive any two periodic signal inputs without departing from the scope of the present disclosure. For the purpose of defining and describing the present disclosure, it is noted that the term "signal" can mean an electrical waveform capable of traveling via a conductive medium.

The PFD 100 can compare a reference signal received on the reference signal input 102 to a clock signal received on the clock signal input 104 to provide output signals indicative of the phase difference between the reference signal and the clock signal. For example, and not by way of limitation, the reference signal, the clock signal, and the output signal may be a digital signal such as a pulse signal or an analog signal. In some embodiments, the PFD 100 can comprise an up channel 106 that outputs an up signal with a pulse duration that is indicative of a duration of time that the rising edge (i.e., the leading edge) of the reference signal leads the rising edge of the clock signal. The up channel 106 may comprise an up signal output 110 in which the up signal is derived from. The PFD 100 can also comprise a down channel 108 for providing a down signal with a pulse duration that is indicative of a duration of time that the rising edge of a clock signal leads the rising edge of a reference signal. The down channel 108 may comprise a down signal output 112 in which the down signal is derived from. It should be understood that while the up signal and the down signal are described herein as a response to the rising edge of the input signals (i.e., the reference and clock signal), the embodiments described herein can also be configured to measure the falling edge of input signals.

Each of the up channel 106 and the down channel 108 can comprise one or more data (hereinafter "D") flip-flops 120. For example, the up channel 106 can comprise a first D flip-flop 122 and the down channel 108 can comprise a second D flip-flop 124. The D flip-flop 120 can be a high performance D flip-flop configured for high speed and high resolution designs. The D flip-flop 120 can comprise a D input 130, a Q output 132, a clock input 134, and active-low clock input 136, and an active-low reset input 138. Each D flip-flop is depicted as a rising-edge triggered D flip-flop with active low reset and can operate according to the truth table shown in Table 1.

TABLE 1

Rising-edge triggered D flip-flop with active low reset truth table.

| $\overline{Rst}$ | Clk  | D | $Q_{current\ state}$ |
|---|---|---|---|
| 0 | 0->1 | 0 | 0 |
| 0 | 0->1 | 1 | 0 |
| 0 | 1->0 | 0 | 0 |
| 0 | 1->0 | 1 | 0 |
| 1 | 0->1 | 0 | 0 |
| 1 | 0->1 | 1 | 1 |
| 1 | 1->0 | 0 | $Q_{prev\ state}$ |
| 1 | 1->0 | 1 | $Q_{prev\ state}$ |

Figure 2:
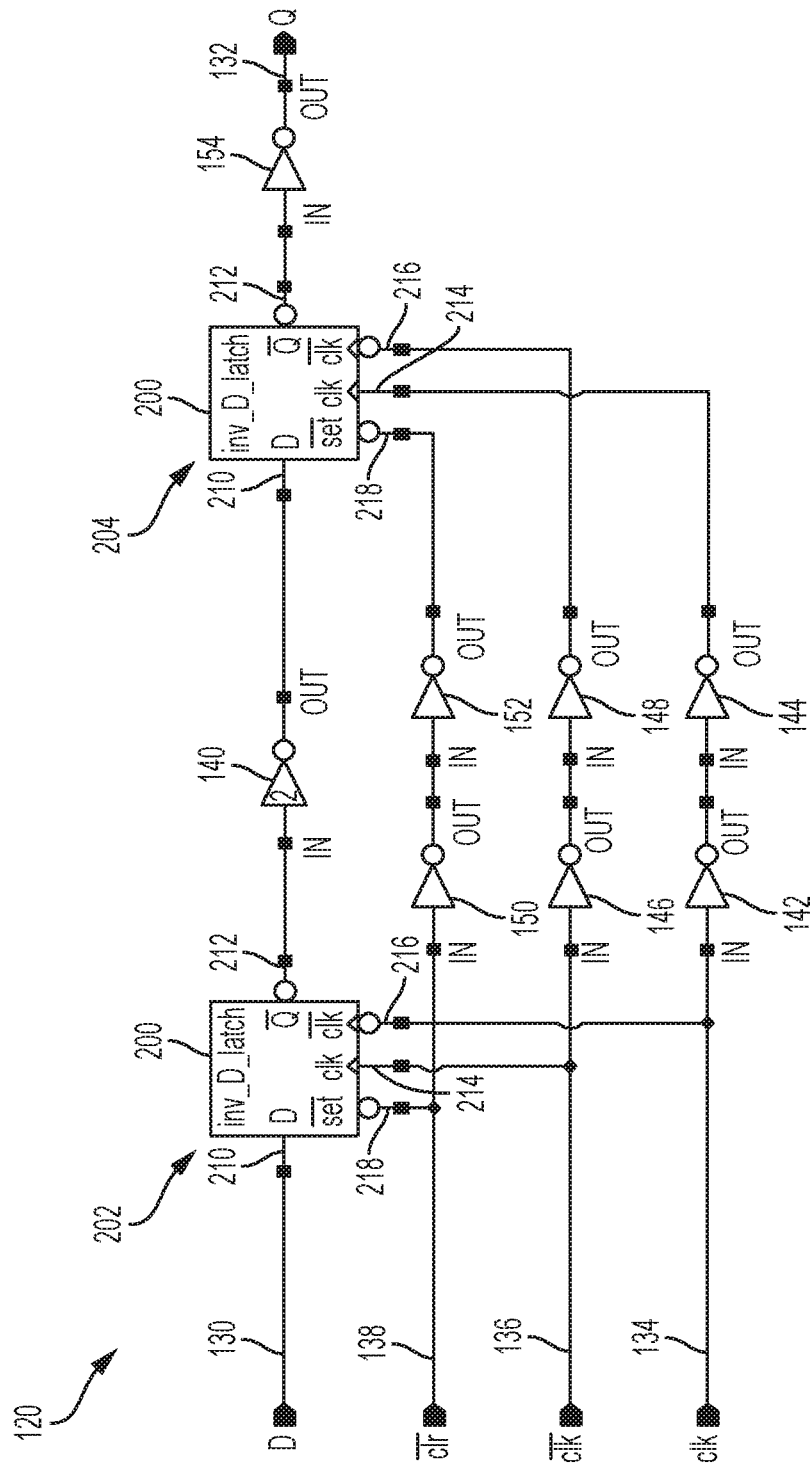
FIG. 2 schematically depicts a D flip-flop according to one or more embodiments shown and described herein.

Referring collectively to FIGS. 1 and 2, the D flip-flop 120 can comprise D-latches 200 for accurate and reliable phase frequency detection. In some embodiments, the D flip-flop 120 can be formed by a first D-latch 202 and a second D-latch 204 connected in series. As used herein, the phrase "connect" can mean to provide a medium for the transmission of electrical signals from one object to another object, which includes objects that are directly connected one another and objects that are connected to one another via one or more intervening components. Generally, the D-latches 200 can be constructed from a series of NAND gates and inverters. Alternatively, the D-latches 200 can be configured as a high performance D-latch constructed in a single stage by using a tristate inverter.

Figure 3:
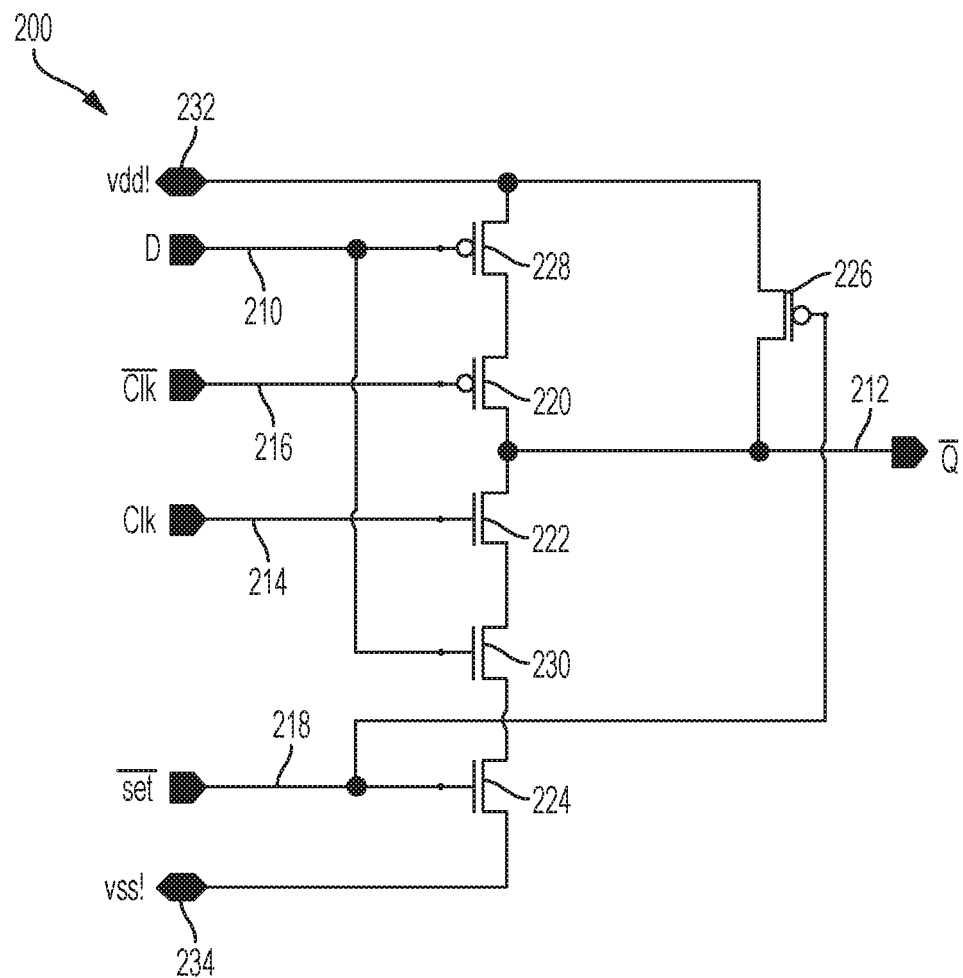
FIG. 3 schematically depicts an inverting D-latch according to one or more embodiments shown and described herein.

Referring collectively to FIGS. 2 and 3, the D-latch 200 can comprise a D input 210, an inverted Q output 212, a clock input 214, and active-low clock input 216, and an active-low set input 218. The D-latch 200 is depicted as a high-level sensitive inverting D-latch with active-low set. The D-latch 200 can operate according to the truth table provided below in Table 2.

TABLE 2

High-level sensitive inverting D-latch with active-low set truth table.

| $\overline{set}$ | Clk | D | $\overline{Q}_{current\ state}$ |
|---|---|---|---|
| 0 | 0 | 0 | 1 |
| 0 | 0 | 1 | 1 |

TABLE 2-continued

High-level sensitive inverting D-latch with active-low set truth table.

| $\overline{set}$ | Clk | D | $\overline{Q}_{current\ state}$ |
|---|---|---|---|
| 0 | 1 | 0 | 1 |
| 0 | 1 | 1 | 1 |
| 1 | 0 | 0 | $\overline{Q}_{prev\ state}$ |
| 1 | 0 | 1 | $\overline{Q}_{prev\ state}$ |
| 1 | 1 | 0 | 1 |
| 1 | 1 | 1 | 0 |

In some embodiments, the D-latch 200 can be formed from a plurality of transistors configured for switching electrical signals such as, for example, Complementary metal-oxide-semiconductor (CMOS) transistors, field-effect transistors (FET), metal-oxide-semiconductor field-effect transistors (MOSFET), or the like. The D-latch 200 can be formed as an inverting D-latch comprising two inner transistors, PMOS transistor 220 and NMOS transistor 222. The drain of the PMOS transistor 220 can be connected to the drain of the NMOS transistor 222. The gate of the PMOS transistor 220 can be connected to the active-low clock input 216. The gate of the NMOS transistor 222 can be connected to the clock input 214. The D-latch 200 can further comprise a NMOS transistor 224 and a PMOS transistor 226 for performing a set operation. Accordingly, the gate of each of the NMOS transistor 224 and the PMOS transistor 226 can be connected to the active-low set input 218. The D input 210 can be connected to the gate of each of the PMOS transistor 228 and the NMOS transistor 230. The drain of the PMOS transistor 228 can be connected to the source of the PMOS transistor 220. The drain of the NMOS transistor 230 can be connected to the source of the NMOS transistor 222. The inverted Q output 212 can be connected to the drain of each of the PMOS transistor 220 and the NMOS transistor 222, and the drain of the PMOS transistor 226. The source of each of the PMOS transistor 228 and the PMOS transistor 226 can be connected to VDD 232. The drain of the NMOS transistor 224 can be connected to the source of the NMOS transistor 230.

When a clock signal is high and received by the clock input 214 and a complimentary pulse-wave signal is low and received by the active-low clock input 216, the PMOS transistor 220 and the NMOS transistor 222 can be activated. Accordingly, the inverted Q output 212 can be the complement of a data signal received at the D input 210. When the clock signal is low and a complimentary pulse-wave signal is low and received by the active-low clock input 216, the PMOS transistor 220 and the NMOS transistor 222 can be deactivated. Accordingly, charge stored on the drain capacitances of PMOS transistor 220 and the NMOS transistor 222 can be disconnected from VDD 232 and ground 234. As a result, the charge can remain and can drive a next stage of gates attached to the inverted Q output 212. The stored voltage can be depleted through a small amount of leakage current. Therefore, the stored voltage may require periodic refreshing. However, the period of most clock signals in practical IC circuits is small enough such that signal refreshing may not be necessary. Additionally, it is noted that an asynchronous set operation can be performed quickly by the D-latch 200, when the PMOS transistor 226 is turned on through an active low signal. It is furthermore noted that the NMOS transistor 224 can operate as a footer transistor to prevent a connection to ground 234 when PMOS transistor 228, PMOS transistor 220, and NMOS transistor 222 are turned on and a logical zero set signal is applied to the active-low set input 218. Accordingly, when the active-low set input 218 receives a logical zero signal, the inverted Q output 212 can output a logical one signal.

Referring collectively to FIGS. 1 and 2, the D flip-flop 120 can be configured as a rising edge, asynchronous reset D flip-flop by utilizing a first D-latch 202 and a second D-latch 204. The D input 130 of the D flip-flop 120 can be connected to the D input 210 of the first D-latch 202. In some embodiments, the first D-latch 202 and the second D-latch 204 can be connected in series with inverters placed after each D-latch (e.g., 202 and 204) to filter out any distortions in the signals on the inverted Q output 212. Specifically, the inverted Q output 212 of the first D-latch 202 can be connected to the input of an inverter 140. The output of the inverter 140 can be connected to the D input 210 of the second D-latch 204. A delay can be applied to the clock signal received by the clock input 134 and the inverted clock signal received by the active-low clock input 136 prior to being received by the second D-latch 204 to compensate for propagation delay of the first D-latch 202 and inverter 140.

In some embodiments, the delay for the clock signal can be applied with inverter 142 and inverter 144 connected in series. Specifically, the clock input 134 of the D flip-flop 120 can be connected to the active-low clock input 216 of the first D-latch 202 and the input of the inverter 142. The output of the inverter 142 can be connected to the input of the inverter 144. The output of the inverter 144 can be connected to clock input 214 of the second D-latch 204. Similarly, the delay for the inverted clock signal can be applied with inverter 146 and inverter 148 connected in series. The active-low clock input 136 of the D flip-flop 120 can be connected to the clock input 214 of the first D-latch 202 and the input of the inverter 146. The output of the inverter 146 can be connected to the input of the inverter 148. The output of the inverter 148 can be connected to active-low clock input 216 of the second D-latch 204. Additionally, a delay can be applied downstream of the active-low reset input 138 with inverter 150 and inverter 152 connected in series. Specifically, the active-low reset input 138 of the D flip-flop 120 can be connected to the active-low set input 218 of the first D-latch 202 and the input of the inverter 150. The output of the inverter 150 can be connected to the input of the inverter 152. The output of the inverter 152 can be connected to the active-low set input 218 of the second D-latch 204.

The D flip-flop 120 can further comprise an inverter 154 connected in series between the inverted Q output 212 of the second D-latch 204 and the Q output 132. Specifically, the input of the inverter 154 can be connected to the inverted Q output 212 of the second D-latch 204 and the output of the inverter 154 can be connected to the Q output 132. The inverter 154 connected to the second D-latch 204 can cause a low active set in the first D-latch 202 and the second D-latch 204 to perform a reset for the D flip-flop 120. Accordingly, when a reset signal is provided as a logical zero on the active-low reset input 138, the Q output of the D flip-flop 120 provides a logical zero signal.

The first D-latch 202 can produce an output signal at the inverted Q output 212 that is the inverse of an input data signal provided via the D input 130 when the clock signal provided at the clock input 134 is a logically high value. During this time, the inverted Q output 212 of the first D-latch 202 can be free to change. Accordingly, when the clock signal provided at the clock input 134 falls to a logically low value, the output signal of the first D-latch 202 can be held constant until the clock signal rises again, i.e., the output signal of the first D-latch 202 can be unaffected by a change from logically high to logically low or from logically low to logically high in the input data signal provided by the D input 130. The second D-latch 204 can produce an output signal at the inverted Q output 212 that is logically the same as the output signal of the first D-latch 202 when the clock signal is logically low. When the clock signal rises from a logically low value to a logically high value, the output signal of the second D-latch 204 can be held constant and then inverted on the Q output 132. Since an even number of inverted operations are performed by the series configuration of the first D-latch 202, inverter 140, the second D-latch 204, and inverter 154, an output signal provided at the Q output 132 of the D flip-flop 120 during the hold operation can be the same, logically, as the input signal provided at the D input 130.

As is noted above, pairs of inverters can be applied to the clock input 214, the active-low clock input 216, and the active-low set input 218 of the second D-latch 204. The pairs of inverters can ensure that the second D-latch 204 activates after the first D-latch 202 and inverter 140 have fully changed logical values. Accordingly, the D flip-flop 120 can hold states for an entire cycle of the input signal, except for relatively short time periods, compared to the period of the input signal, when the clock signal rises.

Figure 4:
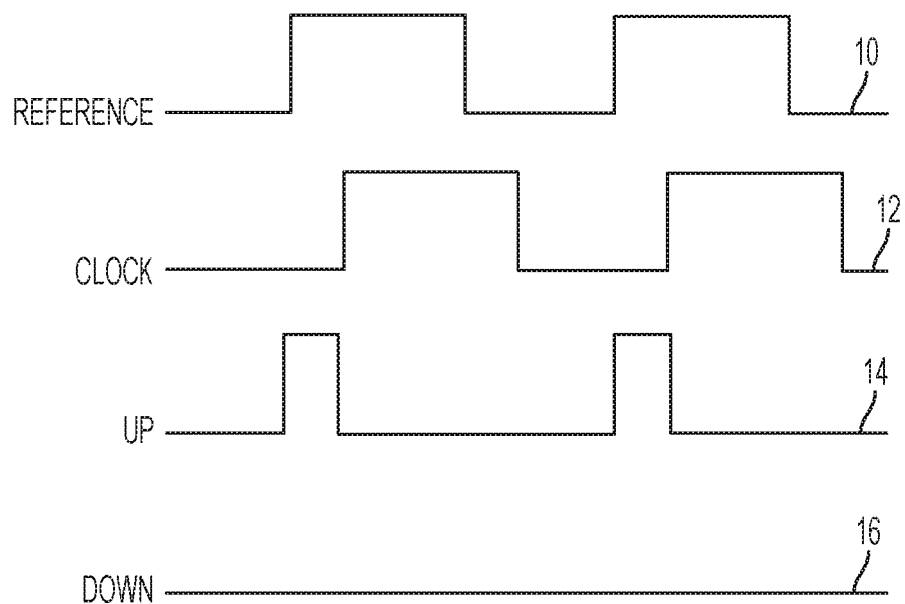
FIG. 4 graphically depicts the input and output signals of a PFD according to one or more embodiments shown and described herein.

Referring collectively to FIGS. 1 and 4, the reference signal input 102 of the PFD 100 can be connected to the clock input 134 of the first D flip-flop 122 and the input of a first inverter 156. The output of first inverter 156 can be connected to the active-low clock input 136 of the first D flip-flop 122. The clock signal input 104 of the PFD 100 can be connected to the clock input 134 of the second D flip-flop 124 and the input of a second inverter 158. The output of second inverter 158 can be connected to the active-low clock input 136 of the second D flip-flop 124.

The PFD 100 can be configured to eliminate feedback in reset operation. In some embodiments, the PFD 100 can comprise a fifth inverter 160 connected to the active-low reset input 138 of the first D flip-flop 122 and a sixth inverter 162 connected to the active-low reset input 138 of the second D flip-flop 124. Additionally, the first D flip-flop 122 can be configured to detect a rising edge of reference signal 10 and can have its active-low reset input 138 driven by an inverted clock signal. The second D flip-flop 124 can be configured to detect a rising edge of clock signal 12 and can have its active-low reset input 138 driven by an inverted reference signal. Accordingly, the reference signal 10 can be received at the reference signal input 102 of the first D flip-flop 122 and the input of the sixth inverter 162. The clock signal 12 can be received at the clock signal input 104 of the second D flip-flop 124 and the input of fifth inverter 160. Additionally, each D input 130 of the first D flip-flop 122 and the second D flip-flop 124 can receive a logical one signal.

It may be desirable to perform a reset operation depending upon the output provided by the up signal output 110 and the down signal output 112. In the embodiment depicted in FIG. 1, the PFD 100 can be immediately reset upon both an up signal 14 provided at the up signal output 110 and a down signal 16 provided at the down signal output 112 rising. Accordingly, the PFD 100 eliminates the need to include additional feedback logic such as, for example, an AND gate or an NAND gate, to detect when both the up signal 14 and the down signal 16 become logically high to perform the reset operation. Instead, the PFD 100 can automatically compute such a reset condition beforehand and perform a reset operation.

As depicted in FIG. 4, the reference signal 10 can rise to a logically high value. While the reference signal 10 remains at the logically high value and before the reference signal 10 falls to a logically low value, the clock signal 12 can rise. In this scenario, the PFD 100 detects the difference in phase and provides the up signal 14, which corresponds to the difference in phase. The PFD 100 detects the phase difference as the time between when the reference signal 10 is logically high and the clock signal 12 is logically low until the clock signal 12 becomes logically high or when the clock signal 12 is logically high and the reference signal 10 is logically low until the reference signal 10 becomes logically high. The up signal 14 becomes logically high for the duration of the phase difference between the reference signal 10 and the clock signal 12. Moreover, the PFD 100 will not produce any glitches on the down signal 16 during this time. Specifically, the down signal 16 remains logically low when the clock signal 12 rises at the end of the phase difference. The suppression of glitches on the down signal 16 can be provided because the active-low reset input 138 of the second D flip-flop 124 is activated by the inverted reference signal. It is noted that the term "glitch," as used herein, can mean an undesired output signal indicative of a non-existent phase difference.

Figure 5:
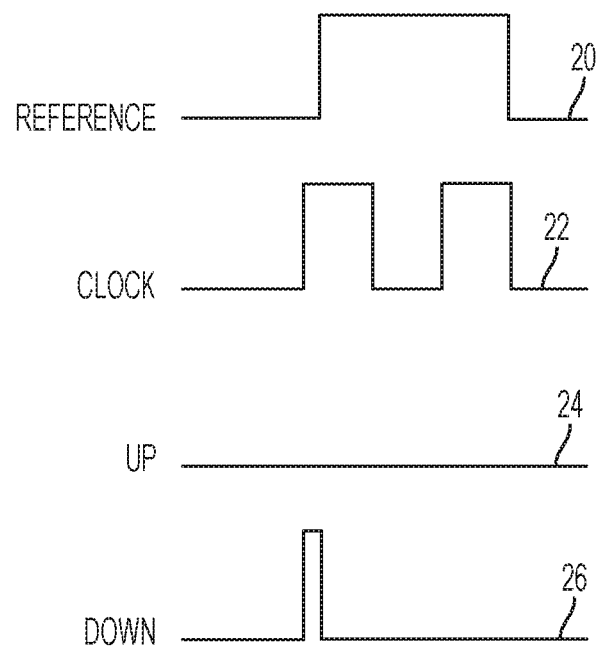
FIG. 5 graphically depicts the input and output signal of the PFD shown in FIG. 1 according to one or more embodiments shown and described herein.

Referring collectively to FIGS. 1 and 5, the PFD 100 can be susceptible to an error for the application of detecting phase differences when the frequency of both input signals are not the same, which can occur when an input signal rises again before the other input signal falls. For example, the PFD 100 can receive a reference signal 20 and a clock signal 22 and output an up signal 24 and a down signal 26, as described hereinbelow. As depicted in FIG. 5, the PFD 100, shown in FIG. 1, can fail to detect a second rising edge of the clock signal 22, when the clock signal 22 has a frequency that is about 1.5 times or more greater than the frequency of the reference signal 20. Specifically, the clock signal 22 can rise a second time before the reference signal 20 falls. While the reference signal 20 is logically high, the clock signal 22 can fall to a logical low and rise again to a logical high. The PFD 100 correctly detects the first phase difference producing a logical high in the down signal 26. However, the PFD 100 skips the second rising edge of the clock signal 22. The skipped rising edge can be attributed to the inverted reference signal that is provided to the active-low reset input 138 of the second D flip-flop 124, which triggers a reset. For applications where the PFD 100 is utilized in wide-band phase locked loop (PLL) with a wide operating range of frequencies, this error can cause a non-linear response and can slow down the system's convergence. In addition to the use of the PFD 100 in wide-band PLLs, non-wide-band PLL startup and reset operations can also temporarily cause such conditions. Furthermore for other applications in signal detection or digital communication beyond PLLs, wide input ranges may be necessary. It is noted that the term "wide input range," as used herein, can correspond to difference in frequency between input signals where one input signal has a frequency that is at least about double the frequency of the other input signal.

Figure 6:
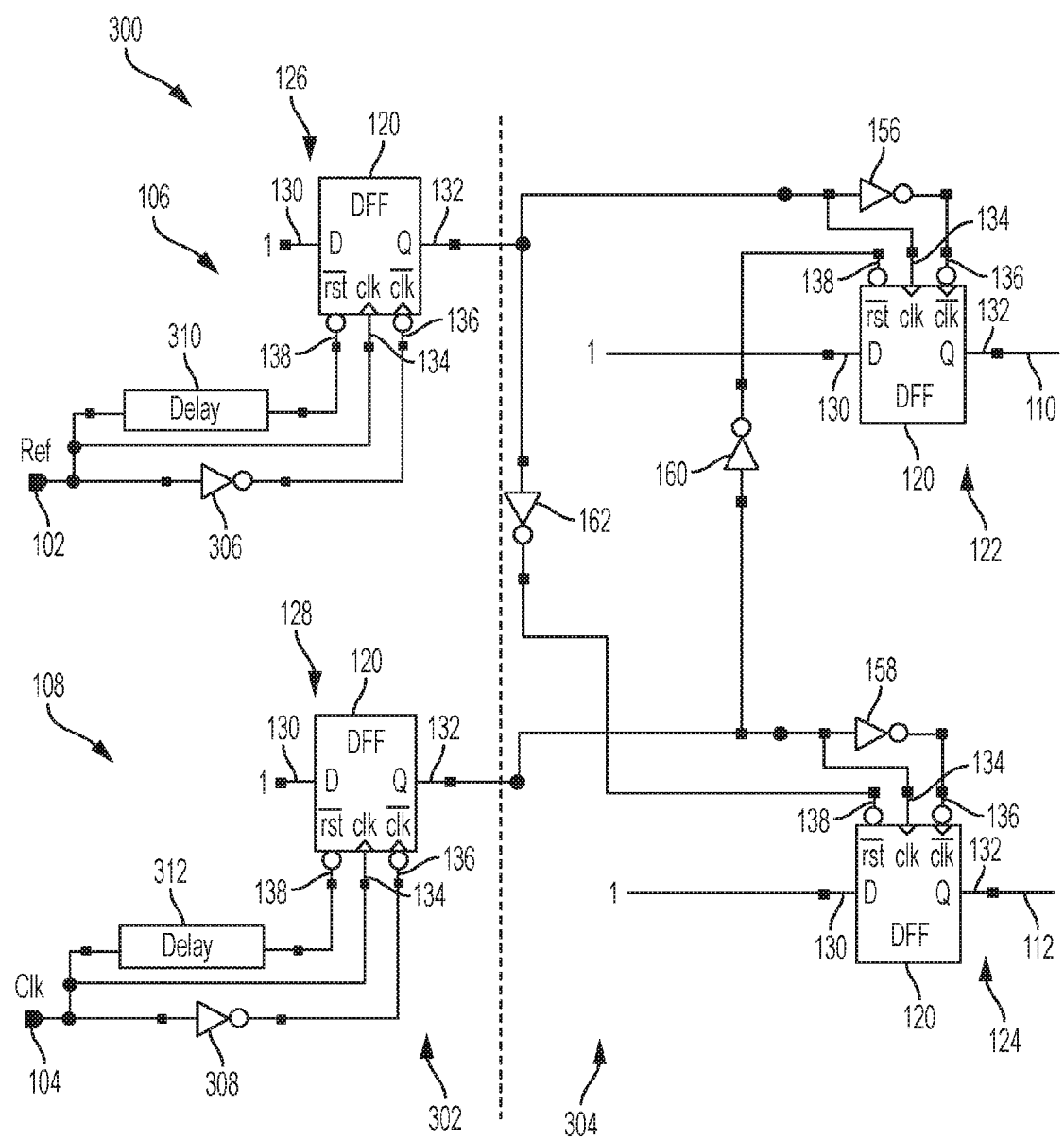
FIG. 6 schematically depicts a PFD according to one or more embodiments shown and described herein.
Figure 7:
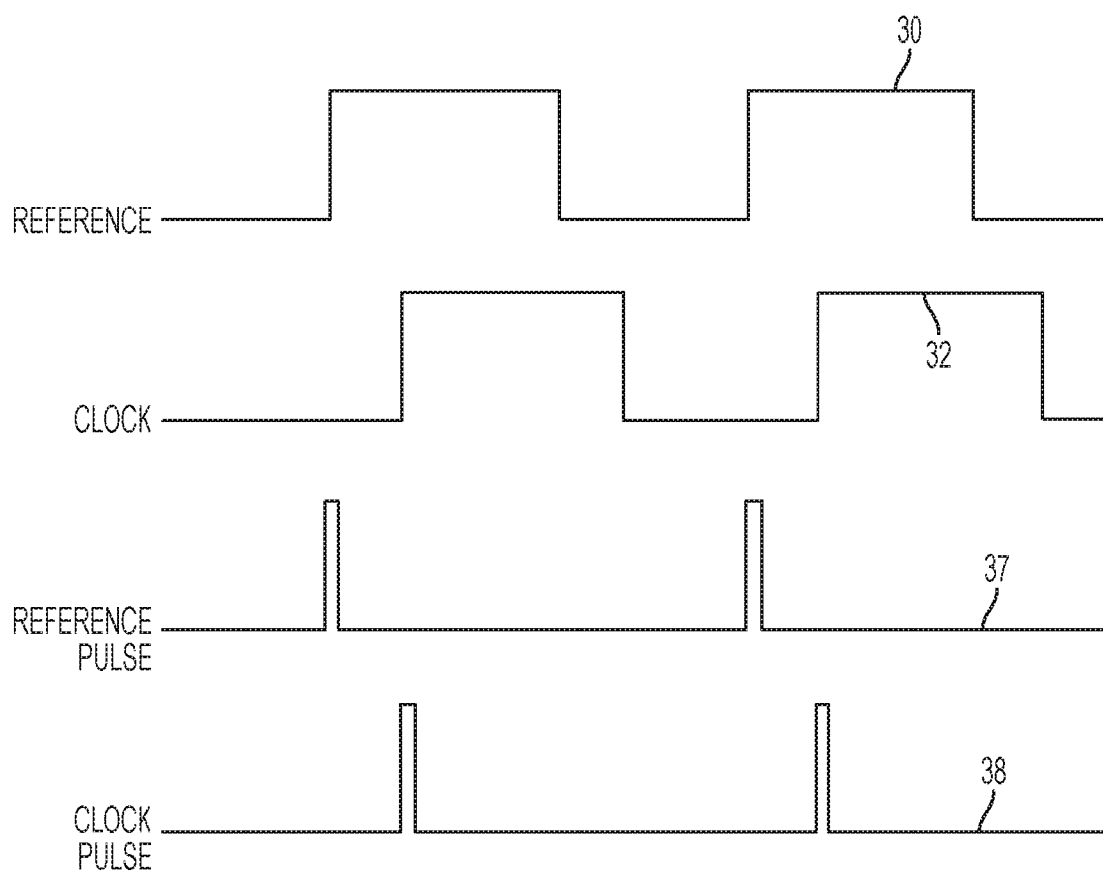
FIG. 7 graphically depicts the input and output signals of a first stage of a PFD with two stages according to one or more embodiments shown and described herein.

Referring collectively to FIGS. 6 and 7, the PFD 300 can be provided by adding an additional stage to the PFD 100 shown in FIG. 1. The additional stage can be configured to prevent the PFD 300 from skipping signal edges, while the other input signal is still logically high. In some embodiments, the PFD 300 can comprise a first stage 302 and a second stage 304. Referring to FIG. 7 which illustrates the input and output signals of the first stage 302 of PFD 300, the first stage 302 of the PFD 300 can comprise a third D flip-flop 126 for detecting a rising edge of a reference signal 30 and providing a reference pulse 37 to the second stage 304. The first stage 302 also comprises a fourth D flip-flop 128 for detecting a rising edge of a clock signal 32 and providing a clock pulse 38 to the second stage 304. The reference signal input 102 of the PFD 300 can be connected to the clock input 134 of the third D flip-flop 126 and the input of a third inverter 306. The output of the third inverter 306 can be connected to the active-low clock input 136 of the third D flip-flop 126. Similarly, the clock signal input 104 of the PFD 300 can be connected to the clock input 134 of the fourth D flip-flop 128 and the input of a fourth inverter 308. The output of the fourth inverter 308 can be connected to the active-low clock input 136 of the fourth D flip-flop 128. A logical high signal can be applied to the D input of each of the third D flip-flop 126 and the fourth D flip-flop 128.

The PFD 300 can be configured to apply a time propagation delay for the reference signal input 102 and clock signal input 104 prior to applying each of the input signals to the active-low reset input 138. In some embodiments, the PFD 300 can comprise a first delay buffer 310 and a second delay buffer 312 for providing the time propagation delay. Each of the first delay buffer 310 and second delay buffer 312 can be formed from one or more buffers that are tuned to provide the desired time propagation delay. In the embodiment depicted in FIG. 6, the reference signal input 102 of the PFD 300 can be connected to the first delay buffer 310, and the first delay buffer 310 can be connected to the active-low reset input 138 of the third D flip-flop 126. The clock signal input 104 of the PFD 300 can be connected to the second delay buffer 312, and the second delay buffer 312 can be connected to the active-low reset input 138 of the fourth D flip-flop 128.

The Q output 132 of each of the third D flip-flop 126 and the fourth D flip-flop 128 in the first stage 302 can produce a short pulse that represents the original input signal, i.e., the reference pulse 37 (shown in FIG. 7) can be provided by the third D flip-flop 126 and the clock pulse 38 (shown in FIG. 7) can be provided by the fourth D flip-flop 128. In some embodiments, the second stage 304 of the PFD 300 (FIG. 6) can be similar to the PFD 100 (shown in FIG. 1), except the components of the PFD 100 connected to the reference signal input 102 and the clock signal input 104 are instead connected to the Q output 132 of the third D flip-flop 126 and the fourth D flip-flop 128. Specifically, the Q output 132 of the third D flip-flop 126 can be connected to the clock input 134 of the first D flip-flop 122, the input of the first inverter 156, and the input of the sixth inverter 162. The output of the first inverter 156 is connected to the active-low clock input of the first D flip-flop. The Q output 132 of the fourth D flip-flop 128 can be connected to the clock input 134 of the second D flip-flop 124, the input of the second inverter 158, and the input of the fifth inverter 160. The output of the second inverter is connected to the active-low clock input of the second D flip-flop. Additionally, each D input 130 of the first D flip-flop 122 and the second D flip-flop 124 can receive a logical one signal.

Figure 8:
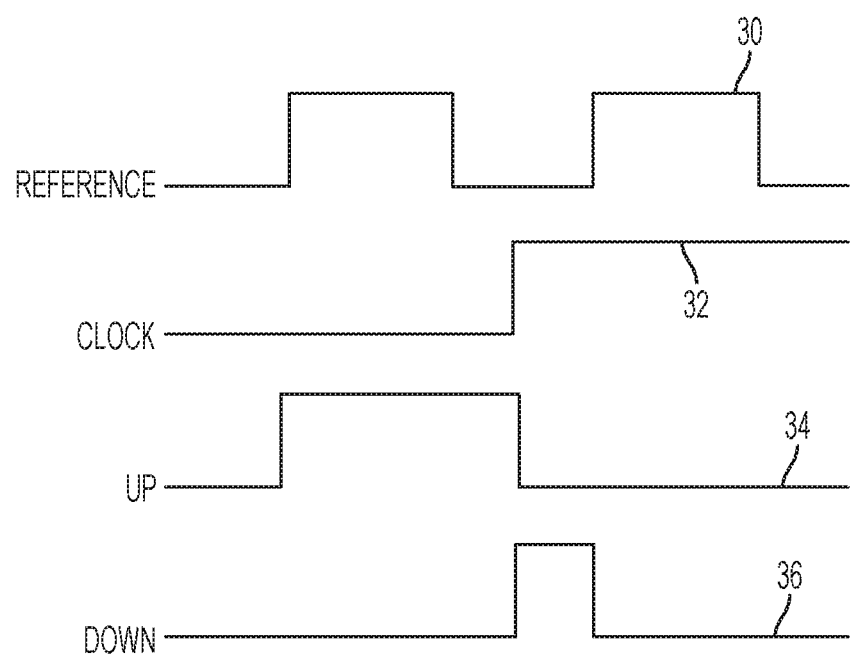
FIG. 8 graphically depicts the input and output signals of the PFD shown in FIG. 6 according to one or more embodiments shown and described herein.

Referring collectively to FIGS. 6 and 8, the PFD 300 mitigates the skipping of necessary signal edges as discussed above in relation to FIG. 5 when the frequencies of both inputs are not the same. However, the PFD 300 can still produce incorrect output signals if the frequency of one input signal is less than half of the other input signal, or if the duty cycle of at least one of the input signals is very low. For example, the PFD 300 can receive a reference signal 30 and a clock signal 32 and output an up signal 34 and a down signal 36, as described hereinabove with respect to the PFD 100 (shown in FIG. 1). As depicted in FIG. 8, the PFD 300 can be susceptible to an error occurring when an input signal rises after the other input signal has fallen. The reference signal 30 rises from a logical low to a logical high and the clock signal 32 rises from a logical low to a logical high after the reference signal 30 has fallen back to a logical low. In this scenario, the up signal 34 rises from a logical low to a logical high for the duration of the phase difference. However, the down signal 36 immediately rises from a logical low to a logical high as soon as the edge of the clock signal 32 arrives, i.e., the up signal 34 and the down signal 36 are adjacent to each other at the edge of the clock signal 32. The down signal 36 is permitted to rise because the active-low reset input 138 of the second D flip-flop 124 is not activated by the inverted reference pulse signal provided by the output of the sixth inverter 162, which is logically high when the edge of the clock signal 32 arrives. PFD 400, described below, addresses the error inherent in PFD 300 of the rise of the input signal after the other input signal has fallen.

Figure 9:
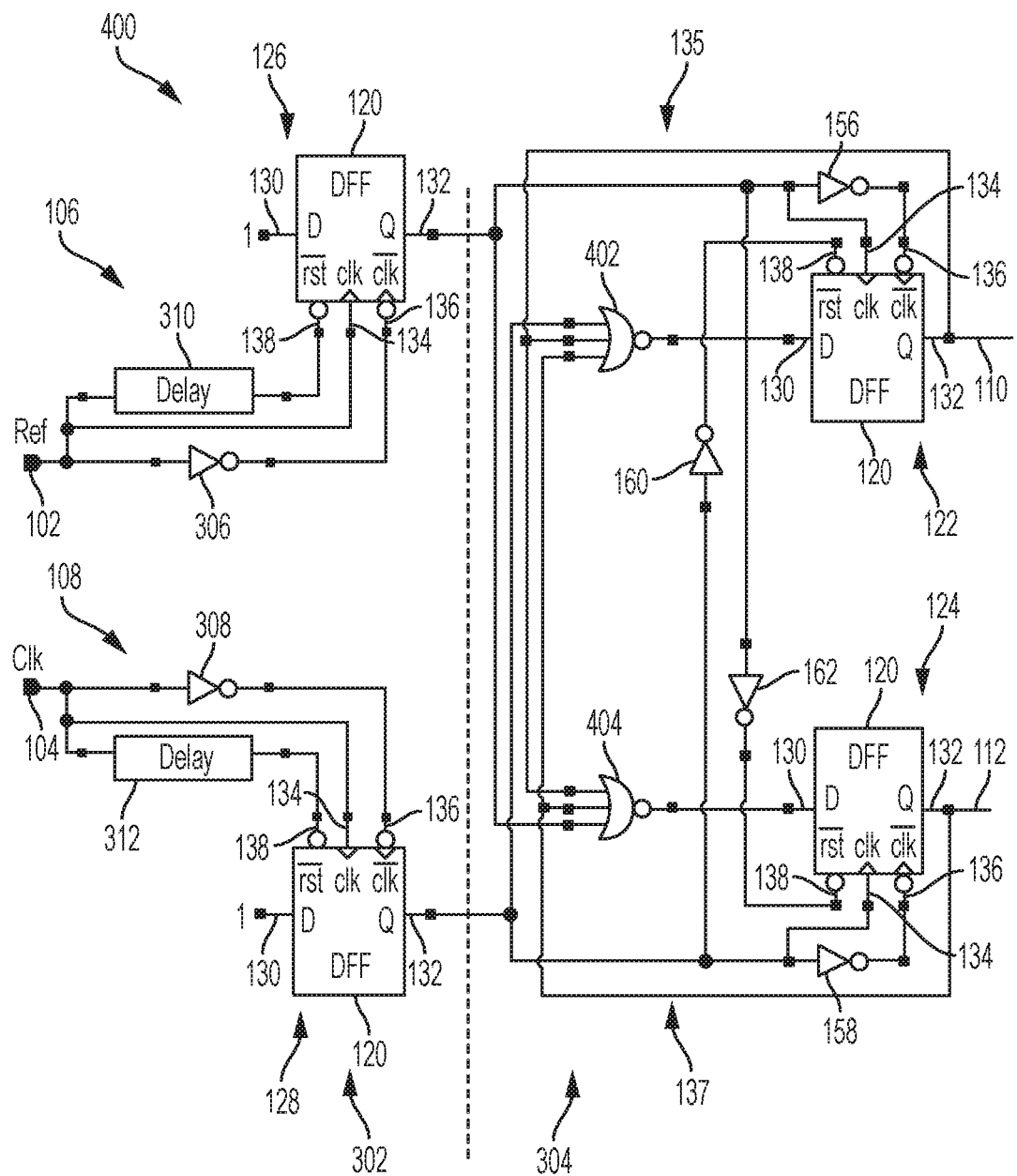
FIGS. 9 and 10 schematically depict PFDs according to one or more embodiments shown and described herein.

Referring now to FIG. 9, an embodiment of the PFD 400 is schematically depicted. In some embodiments, the D input 130 of the D flip-flops 120 in the second stage 304 can be driven by a logic gate to prevent the up signal 34 and the down signal 36 from being adjacent to each other. In some embodiments, the D input 130 of the first D flip-flop 122 can be connected to the output of first NOR gate 402 and the D input 130 of the second D flip-flop 124 can be connected to the output of second NOR gate 404. The Q output 132 of each of the fourth D flip-flop 128, the first D flip-flop 122, and the second D flip-flop 124 can be connected to an input of the first NOR gate 402. The Q output 132 of each of the third D flip-flop 126, the first D flip-flop 122, and the second D flip-flop 124 can be connected to an input of the second NOR gate 404.

In the second stage 304 of the PFD 400, the D flip-flops 120 can only transition to a logically high signal on the Q output 132 when the signal applied to the D input 130 is logically high. In the first NOR gate 402, the up signal provided at the up signal output 110 and the down signal down provided at the down signal output 112 can ensure that the first D flip-flop 122 can only transition to a high logical value if the up signal output 110 and the down signal output 112 are already logically low. In the second NOR gate 404, the up signal provided at the up signal output 110 and the down signal down provided at the down signal output 112 can ensure that the second D flip-flop 124 can only transition to a high logical value if the up signal output 110 and the down signal output 112 are already logically low. The clock pulse provided by the Q output 132 of the fourth D flip-flop 128 can ensure that the output of the first NOR gate 402 falls as the reset operation of the first D flip-flop 122 occurs and can reduce the time propagation delay of the reset operation of the first D flip-flop 122. The reference pulse provided by the Q output 132 of the third D flip-flop 126 can ensure that the output of the second NOR gate 404 falls as the reset operation of the second D flip-flop 124 occurs, which can reduce the time propagation delay of the reset operation of the second D flip-flop 124. PFD 400 includes two feedback paths 135 and 137. The first intra-stage feedback path 135 is the connection of the Q output 132 of the first D flip-flop 122 to an input of NOR gate 402 and NOR gate 404. The second intra-stage feedback path 137 is the connection of the Q output 132 of the second D flip-flop 124 to an input of NOR gate 402 and NOR gate 404. Although two feedback paths (i.e., 135 and 137) are introduced to the PFD 400, the feedback paths are not part of the reset operation of the PFD 400. Therefore, the feedback paths 135 and 137 do not limit dead zone performance of PFD 400.

Figure 10:
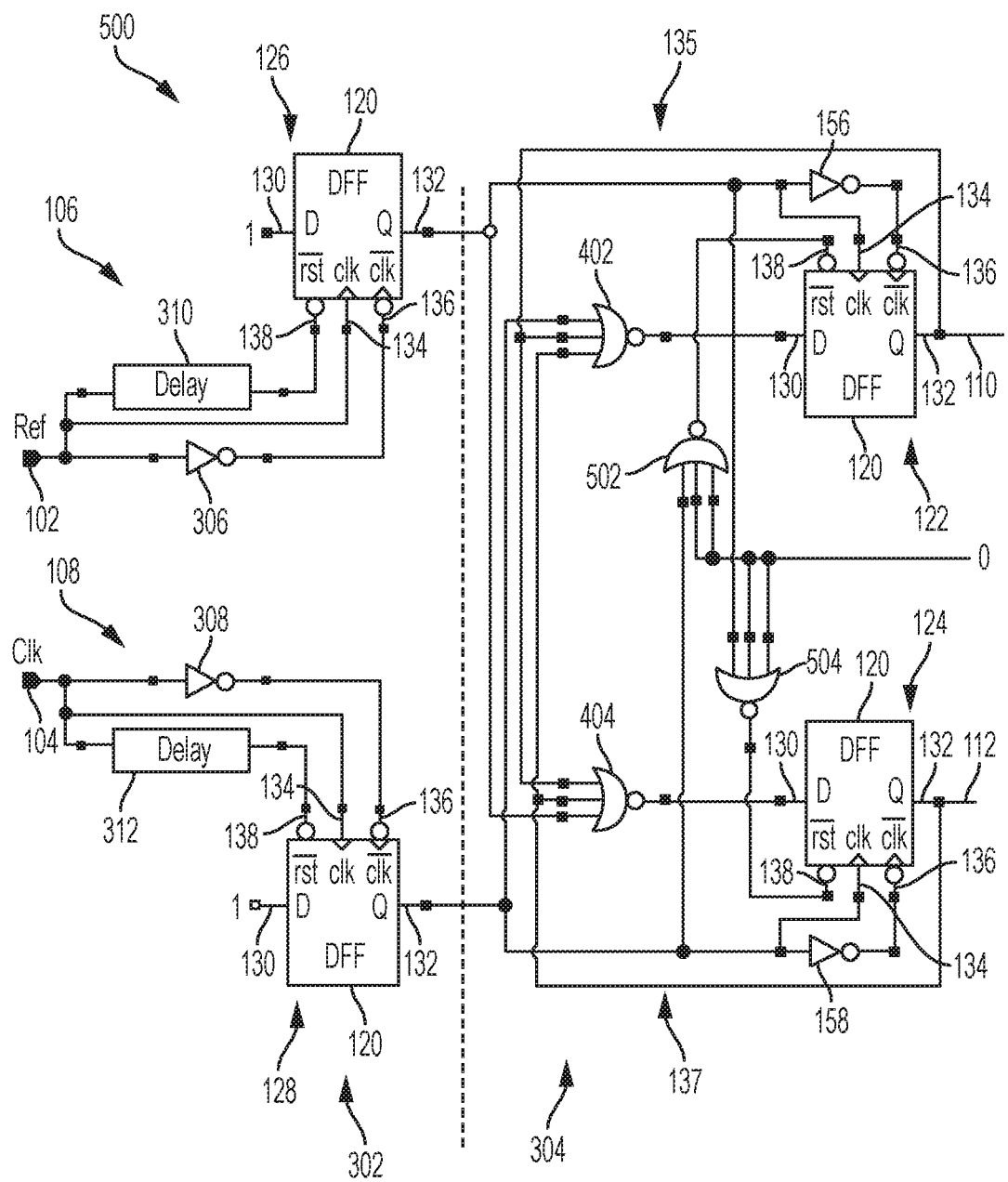

Referring now to FIG. 10, an embodiment of the PFD 500 is schematically depicted. The PFD 500 can comprise logic gates that ensure similar arrival times for signals provided to the D input 130 and the active-low reset input 138 of the D flip-flops 120 in the second stage 304. In some embodiments, the fifth inverter 160 (FIGS. 6 and 9) can be replaced with a third NOR gate 502 and the sixth inverter 162 (FIGS. 6 and 9) can be replaced with fourth NOR gate 504. Specifically, the output of the third NOR gate 502 can be connected to the active-low reset input 138 of the first D flip-flop 122. The third NOR gate 502 can have a single input connected to the Q output 132 of the fourth D flip-flop 128 for receiving the clock pulse and two inputs connected to ground or a common reference voltage. The output of the fourth NOR gate 504 can be connected to the active-low reset input 138 of the second D flip-flop 124. The fourth NOR gate 504 can have a single input connected to the Q output 132 of the third D flip-flop 126 for receiving the reference pulse and two inputs connected to ground or a common reference voltage.

Figure 11:
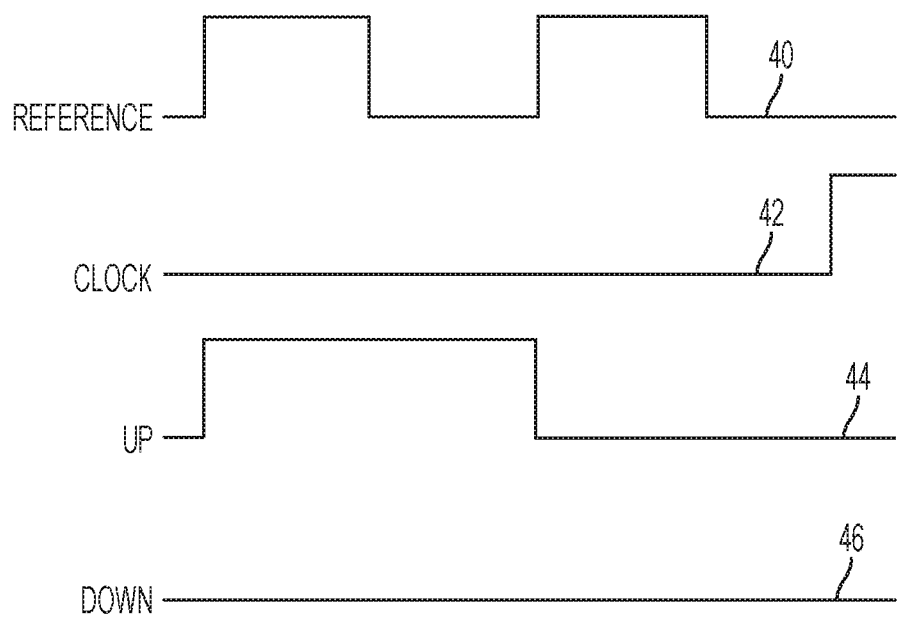
FIG. 11 graphically depicts the input and output signals of the PFD shown in FIG. 10 according to one or more embodiments shown and described herein.

Referring collectively to FIGS. 10 and 11, the PFD 500 can be susceptible to errors caused by a wide input range, i.e., an input signal rises twice before the other input signal rises a single time. In other words, the PFD 500 can output erroneous signals if the input signals have a frequency difference greater than a multiple of about two. For example, the PFD 500 can receive a reference signal 40 and a clock signal 42 and output an up signal 44 and a down signal 46, as described hereinabove with respect to the PFD 100 (FIG. 1). As depicted in FIG. 11, the reference signal 40 can have a frequency that is greater than about double the frequency of the clock signal 42. Accordingly, the reference signal 40 can rise from a logical zero to a logical one and fall to a logical zero twice before the clock signal 42 rises a single time. The PFD 500 can respond by outputting the up signal 44, which rises when the reference signal 40 rises. However, the up signal 44 falls on the second rising edge of the reference signal 40, instead of the rising edge of the clock signal 42. In this example, the first stage 302 produces a reference pulse from the Q output 132 of the third D flip-flop 126. The reference pulse can cause the first D flip-flop 122 to store a logical low value from the first NOR gate 402, which is connected to the D input 130 of the first D flip-flop 122.

Figure 12:
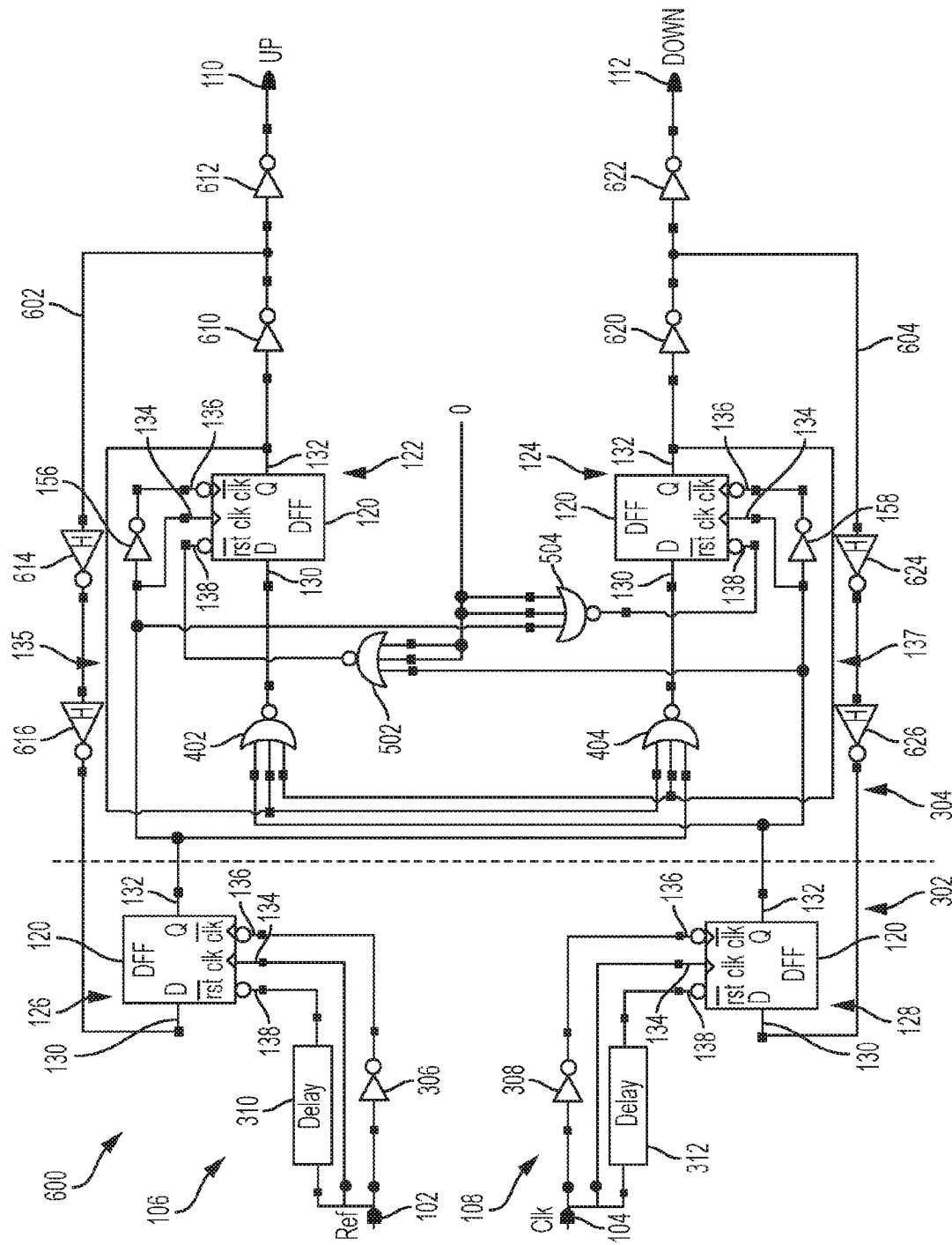
FIG. 12 schematically depicts a PFD according to one or more embodiments shown and described herein.

Referring now to FIG. 12, the PFD 600 can mitigate such errors by introducing feedback from the second stage 304 to the first stage 302. The feedback can operate to ensure that first stage 302 will not produce a reference pulse or a clock pulse, if a corresponding output in the second stage 304 is logically high. In some embodiments, inverted output signals from the second stage 304 can be connected to the D input 130 of the D flip-flops 120 in the first stage 302 via first inter-stage feedback path 602 and second inter-stage feedback path 604. The inverted output signal from the up channel 106 can be provided via first inter-stage feedback path 602 and the inverted output signal from the down channel 108 can be provided via second inter-stage feedback path 604.

The addition of feedback can increase the output load (e.g., load capacitance) of the PFD 600, which can adversely affect resolution for input signals having pulses of a few picoseconds or several hundred femtoseconds. The adverse effect of the feedback can be mitigated by adding a buffer to the output of the second stage 304. As depicted in FIG. 12, the D flip-flops 120, having a relatively large driving strength, can directly drive input of the first NOR gate 402, the second NOR gate 404, the third NOR gate 502, and the fourth NOR gate 504. The buffer of the up channel 106 can comprise a seventh inverter 610 and an eighth inverter 612. The buffer of the down channel 108 can comprise a ninth inverter 620 and a tenth inverter 622. The input of the seventh inverter 610 can be connected to the Q output 132 of the first D flip-flop 122. The output of the seventh inverter 610 can be connected to the input of the eighth inverter 612 and the first inter-stage feedback path 602. The output of the eighth inverter 612 can be connected to the up signal output 110. The input of the ninth inverter 620 can be connected to the Q output 132 of the second D flip-flop 124. The output of the ninth inverter 620 can be connected to the input of the tenth inverter 622 and the second inter-stage feedback path 604. The output of the tenth inverter 622 can be connected to the down signal output 112. Accordingly, the first inter-stage feedback path 602 can be connected between the seventh inverter 610 and the eighth inverter 612 and the second inter-stage feedback path 604 can be connected between the ninth inverter 620 and the tenth inverter 622. The separation of feedback paths 602 and 604 by the seventh inverter 610 and the ninth inverter 620 respectively can ensure that each stage can better drive its load.

To provide feedback from the second stage 304 to the first stage 302, the seventh inverter 610 and the ninth inverter 620 can be affected by a relatively demanding load. Each of the seventh inverter 610 and the ninth inverter 620 drives a D flip-flop 120 of the first stage 302, which can include relatively large transistors requiring a relatively high driving strength. To reduce the immediate load capacitance of the output of the PFD 600, a second buffer can be included in the feedback path. Specifically, the buffer of the first inter-stage feedback path 602 can comprise a first feedback inverter 614 and a second feedback inverter 616 connected in series. In the embodiment depicted in FIG. 12, the first inter-stage feedback path 602 can be provided by connecting the output of the seventh inverter 610 to the input of the first feedback inverter 614. The output of the first feedback inverter 614 can be connected to the input of the second feedback inverter 616. The output of the second feedback inverter 616 can be connected to the D input 130 of the third D flip-flop 126. The buffer of the second inter-stage feedback path 604 can comprise the third feedback inverter 624 and the fourth feedback inverter 626 connected in series. The second inter-stage feedback path 604 can be provided by connecting the output of the ninth inverter 620 to the input of the third feedback inverter 624. The output of the third feedback inverter 624 can be connected to the input of the fourth feedback inverter 626. The output of the fourth feedback inverter 626 can be connected to the D input 130 of the fourth D flip-flop 128. It is noted that the path propagation delay of the first inter-stage feedback path 602 and the second inter-stage feedback path 604 can be tuned to limit the maximum operating frequency of the PFD 600. Accordingly, in some embodiments, each of the first feedback inverter 614, the second feedback inverter 616, the third feedback inverter 624, and the fourth feedback inverter 626 can be a high-skew inverter for reducing the size of the PMOS transistor by about half, which in turn reduces the load capacitance seen by seventh inverter 610 and ninth inverter 620.

Figure 13:
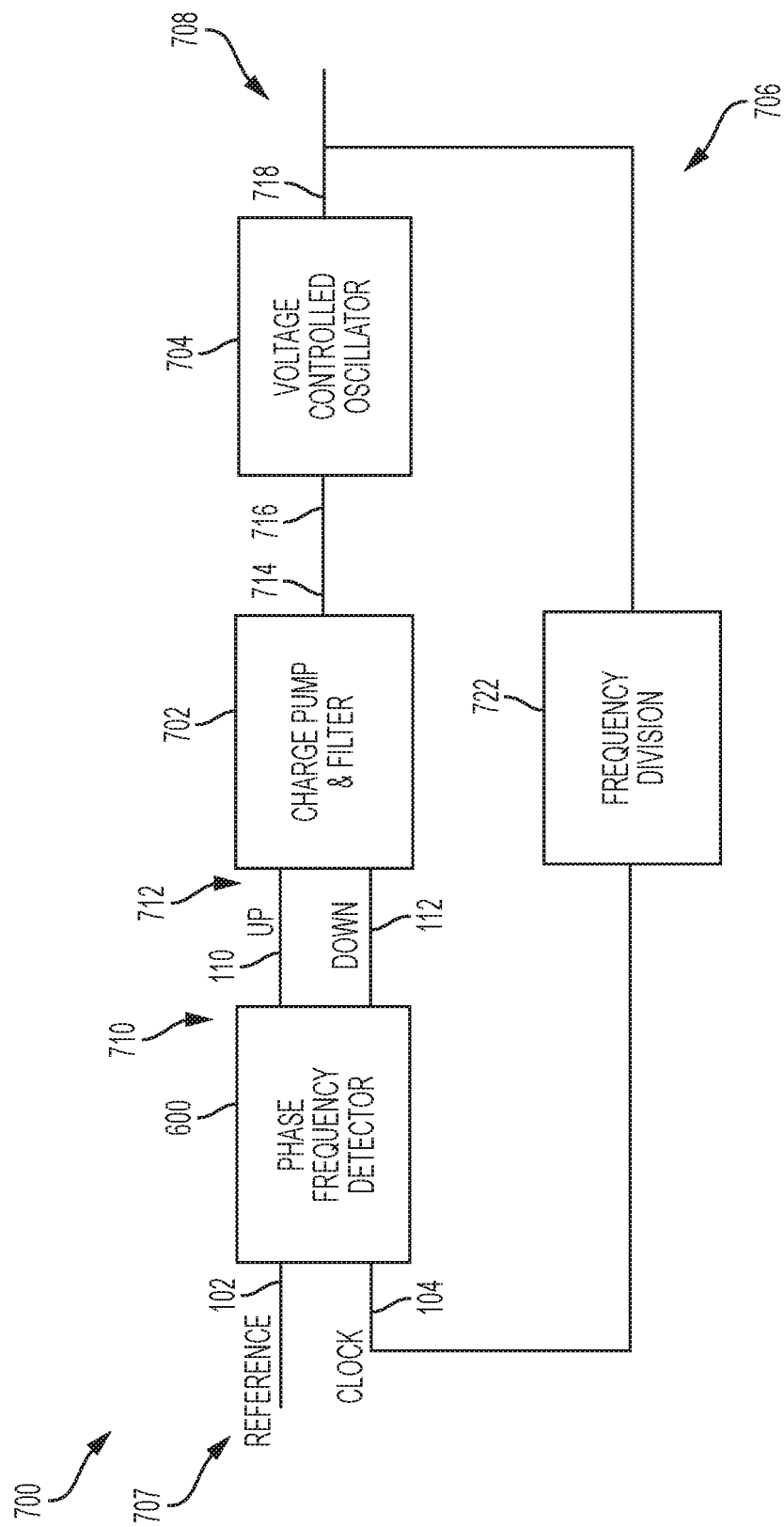
FIG. 13 schematically depicts a phase lock loop control system according to one or more embodiments shown and described herein FIGS. 14-18 graphically depict the input and output signals of the PFD of FIG. 12 according to one or more embodiments shown and described herein.

Referring now to FIG. 13, a phase lock loop (PLL) control system 700 is shown. The PLL control system 700 comprises the PFD 600 as shown in FIG. 12, a charge pump & low-pass filter circuit 702, a voltage-controlled oscillator 704, a feedback path 706, a signal input 707, and a signal output 708. The PFD 600 comprises the reference signal input 102, the clock signal input 104, and the PFD output 710 which comprises the up signal output 110, and the down signal output 112. The charge pump & low-pass filter circuit 702 comprises a circuit input 712 and a circuit output 714. The voltage-controlled oscillator 704 comprises a voltage input 716 and a voltage output 718.

The signal input 707 is connected to the reference signal input 102 of the PFD 600. The PFD output 710 is connected to the circuit input 712 of the charge pump & low-pass filter circuit 702. The circuit output 714 of the charge pump & low-pass filter circuit 702 is connected to the voltage input 716 of the voltage-controlled oscillator 704. The voltage output 718 of the voltage-controlled oscillator 704 is connected to the signal output 708 and the feedback path 706. The feedback path 706 is connected to the clock signal input 104 of the PFD 600 and includes a frequency divider 722.

Experimental Results

The PFD 600 was analyzed utilizing electronic design automation (EDA) software developed by Cadence Design Systems, Inc. of San Jose, Calif., USA. The PFD was chosen as a 90 nm CMOS process, as defined by an IBM library in the EDA software. The results of the analysis are provided in detail below. The analysis demonstrated that the PFD 600 has the advantages of high resolution, wide input range, a balanced up signal and down signal, and a linear output pulse width relative to input phase difference, while maintaining a maximum operating frequency of 2 GHz. Additionally, the analysis demonstrated that the PFD 600 only produces a pulse on a single output signal and mitigates overlapping the up signal and down signal.

Figure 14:
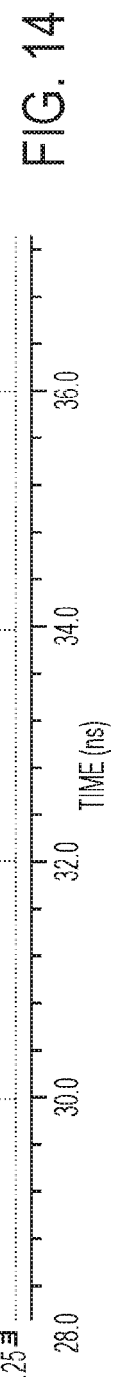

Referring collectively to FIGS. 12 and 14, a reference signal 50 was inputted to the reference signal input 102 and a clock signal 52 to the clock signal input 104 of the PFD 600. In response to the input, the PFD 600 output an up signal 54 on the up signal output 110 and a down signal 56 on the down signal output 112. The clock signal 52 leads the reference signal 50. As a result, the down signal 56 generated pulses corresponding to rising edges of the clock signal 52 that persisted until the next rising edge of the reference signal 50. The up signal 54 correctly maintained a logical zero state without producing any glitches.

Figure 15:
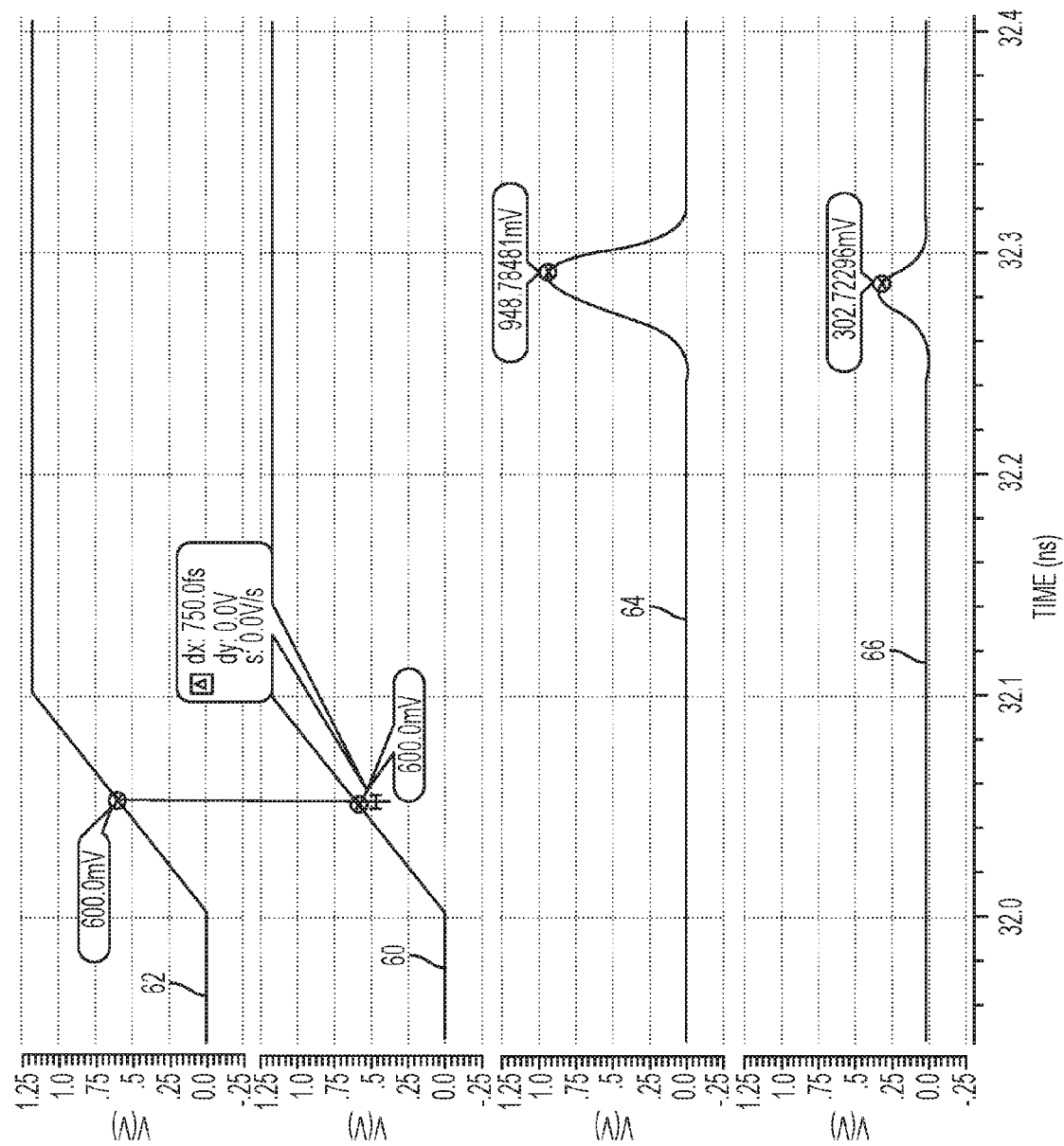

Referring collectively to FIGS. 12 and 15, the PFD 600 was modeled utilizing a typical PMOS and a typical NMOS process corner, which generally corresponds to nominally manufactured hardware. A reference signal 60 was inputted into the reference signal input 102 and a clock signal 62 to the clock signal input 104 of the PFD 600. In response to the input, the PFD 600 output an up signal 66 on the up signal output 110 and a down signal 64 on the down signal output 112. The clock signal 62 can lead the reference signal 60 by about 750 femtoseconds or greater. As a result, the down signal 64 generated a single pulse corresponding to the rising edge of the clock signal 62 that persisted until the rising edge of the reference signal 60. The pulse of the down signal 64 had a peak of about 948.8 millivolts, which is greater than a threshold voltage of about 600 millivolts. The up signal 66 correctly substantially maintained a logical zero state with a single glitch. However, the glitch had a peak voltage of about 302.7 millivolts, which is less than the threshold voltage of about 600 millivolts. Accordingly, the PFD 600 performed correctly as the glitch was substantially suppressed.

Figure 16:
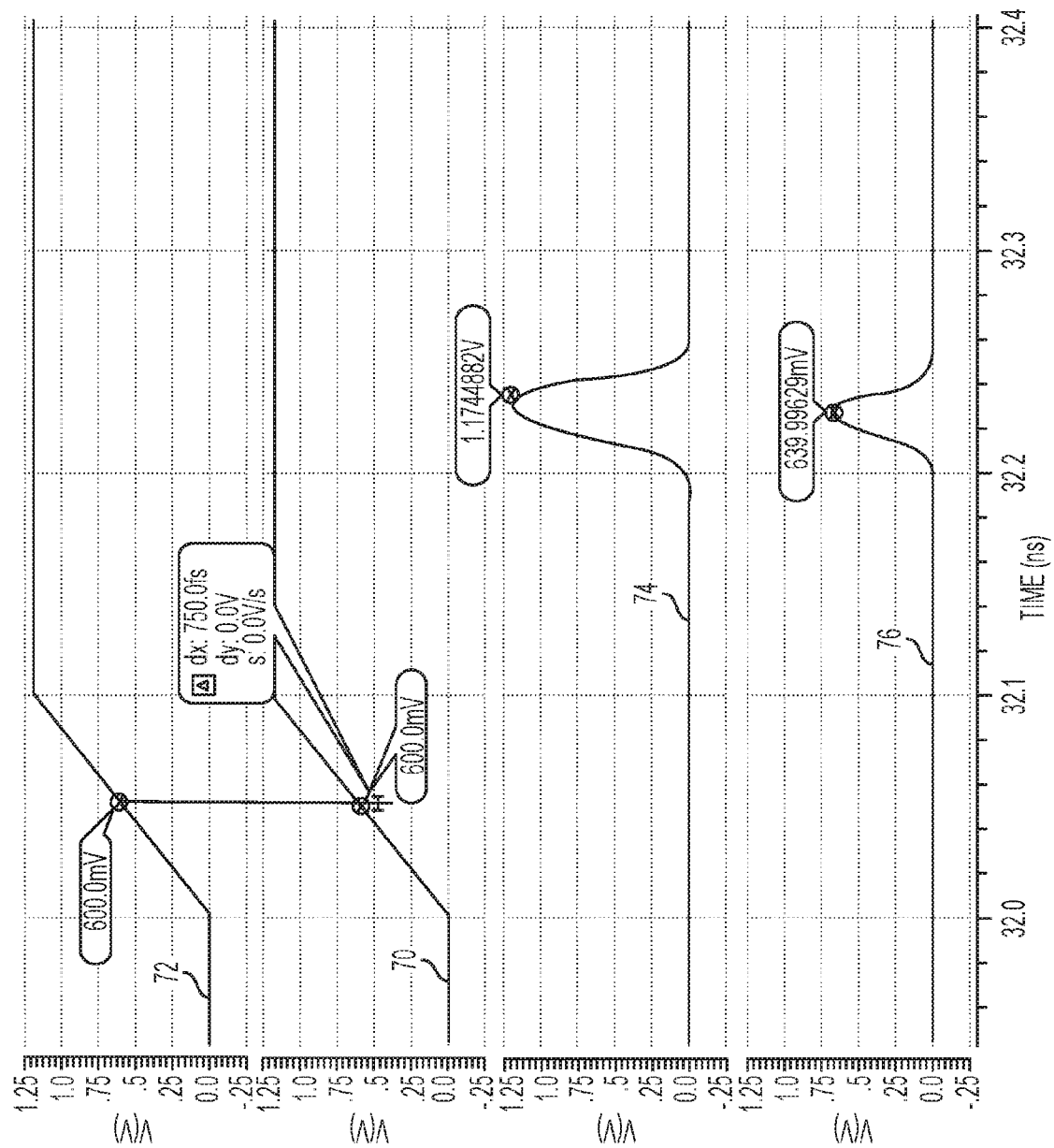

Referring collectively to FIGS. 12 and 16, the PFD 600 was modeled utilizing a fast PMOS and a fast NMOS process corner, which generally corresponds to hardware that performs substantially faster than nominally manufactured hardware. A reference signal 70 was inputted into the reference signal input 102 and a clock signal 72 to the clock signal input 104 of the PFD 600. In response to the input, the PFD 600 output an up signal 76 on the up signal output 110 and a down signal 74 on the down signal output 112. The clock signal 72 can lead the reference signal 70 by about 750 femtoseconds or greater. As a result, the down signal 74 generated a single pulse corresponding to the rising edge of the clock signal 72 that persisted until the rising edge of the reference signal 70. The pulse of the down signal 74 had a peak of about 1.17 volts, which is greater than a threshold voltage of about 600 millivolts. The up signal 76 correctly substantially maintained a logical zero state with a single glitch. However, the glitch had a peak voltage of about 640.0 millivolts, which is slightly greater than the threshold voltage of about 600 millivolts. Considering that the experiment utilized the relatively difficult fast PMOS fast NMOS process corner, the PFD 600 performed relatively well as the glitch was nearly suppressed.

Figure 17:
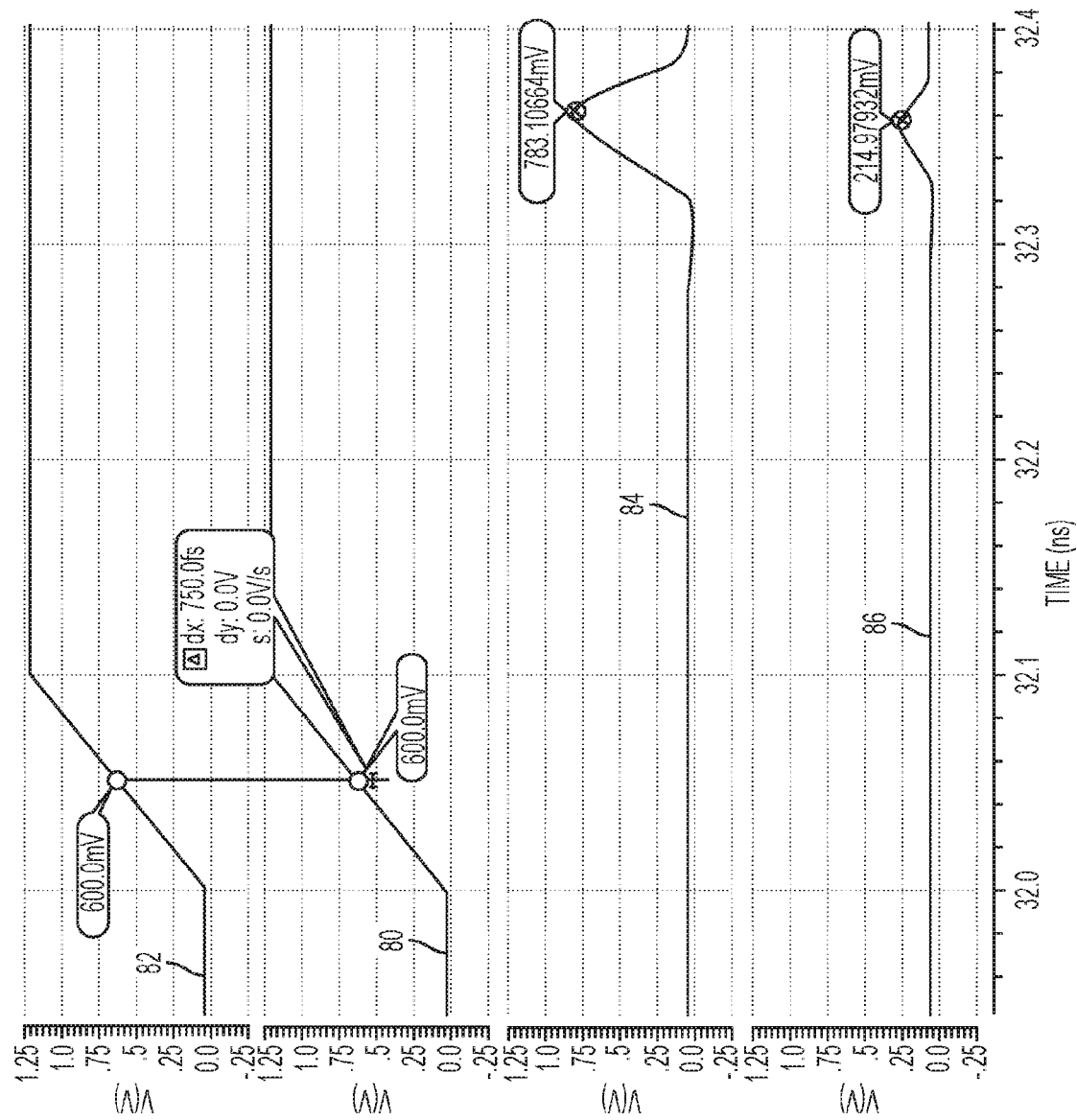

Referring collectively to FIGS. 12 and 17, the PFD 600 was modeled utilizing a slow PMOS and a slow NMOS process corner, which generally corresponds to hardware that performs substantially faster than nominally manufactured hardware. A reference signal 80 was inputted into the reference signal input 102 and a clock signal 82 to the clock signal input 104 of the PFD 600. In response to the input, the PFD 600 output an up signal 86 on the up signal output 110 and a down signal 84 on the down signal output 112. The clock signal 82 can lead the reference signal 80 by about 750 femtoseconds or greater. As a result, the down signal 84 generated a single pulse corresponding to the rising edge of the clock signal 82 that persisted until the rising edge of the reference signal 80. The pulse of the down signal 84 had a peak of about 783.1 millivolts, which is greater than the threshold voltage of about 600 millivolts. The up signal 86 correctly substantially maintained a logical zero state with a single glitch. However, the glitch had a peak voltage of about 215.0 millivolts, which is less than the threshold voltage of about 600 millivolts. Accordingly, the PFD 600 performed correctly as the glitch was substantially suppressed. As demonstrated in the results depicted in FIGS. 15-17, as the phase difference approaches zero, a low amplitude glitch, i.e., undesired output pulse, can be created on the opposite signal. Generally, the glitch did not have a high enough voltage to surpass the threshold voltage of transistors.

Figure 18:
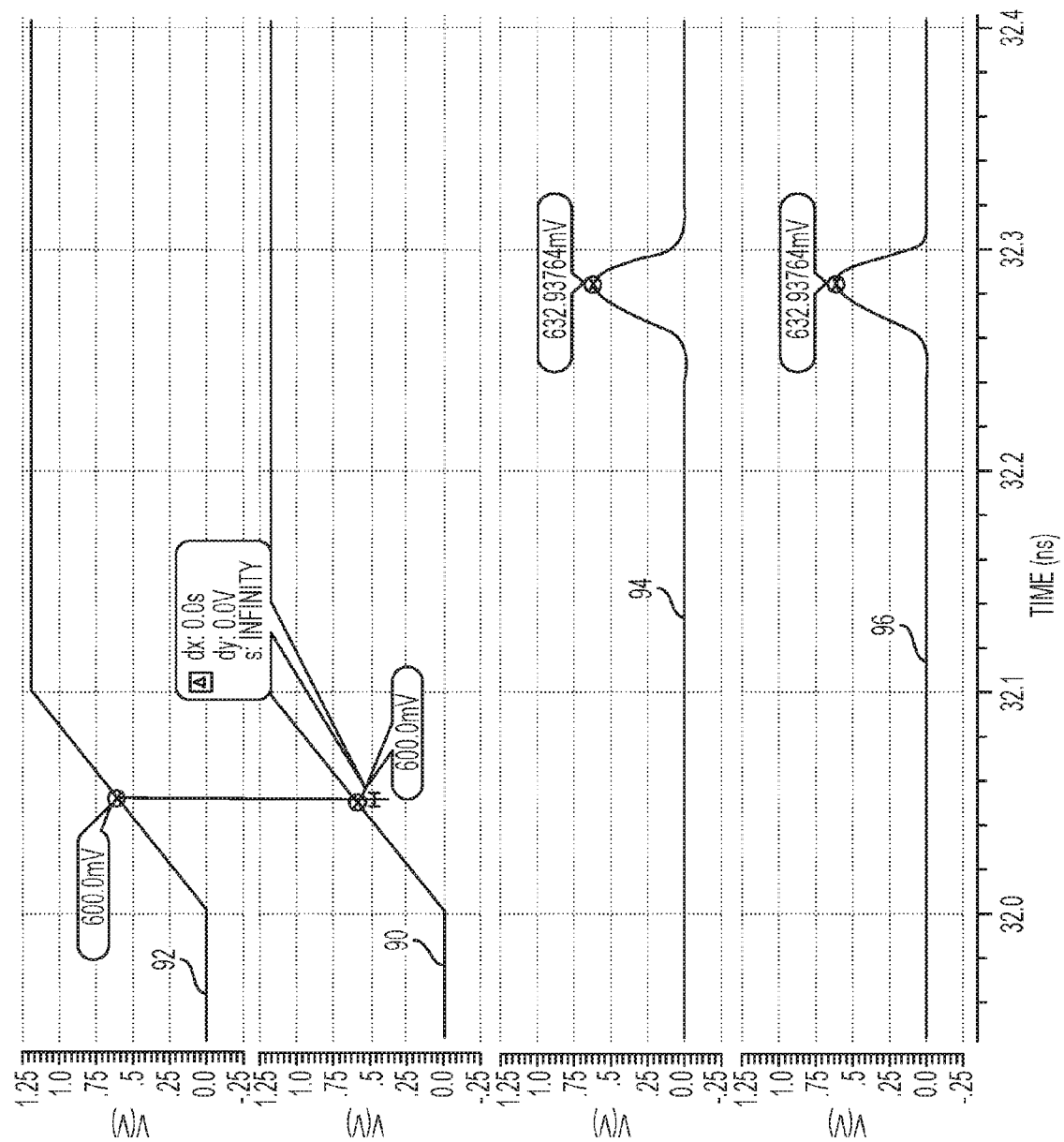

Referring collectively to FIGS. 12 and 18, a reference signal 90 was inputted into the reference signal input 102 and a clock signal 92 to the clock signal input 104 of the PFD 600. In response to the input, the PFD 600 output an up signal 96 on the up signal output 110 and a down signal 94 on the down signal output 112. The clock signal 92 and the reference signal 90 arrived at the PFD 600 at the exact same time. As a result, each of the down signal 94 and the up signal 96 correctly substantially maintained a logical zero state with a single glitch. However, each glitch had a peak voltage of about 632.9 millivolts, which is slightly greater than the threshold voltage of about 600 millivolts. The PFD 600 performed relatively well as the glitches were nearly suppressed. It is noted that careful sizing of the seventh inverter 610, the eighth inverter 612, the ninth inverter 620, and tenth inverter 622 can further suppress the glitches. Furthermore, the eighth inverter 612 and the tenth inverter 622 can be sized provide the necessary current to drive various loads.

Figure 19:
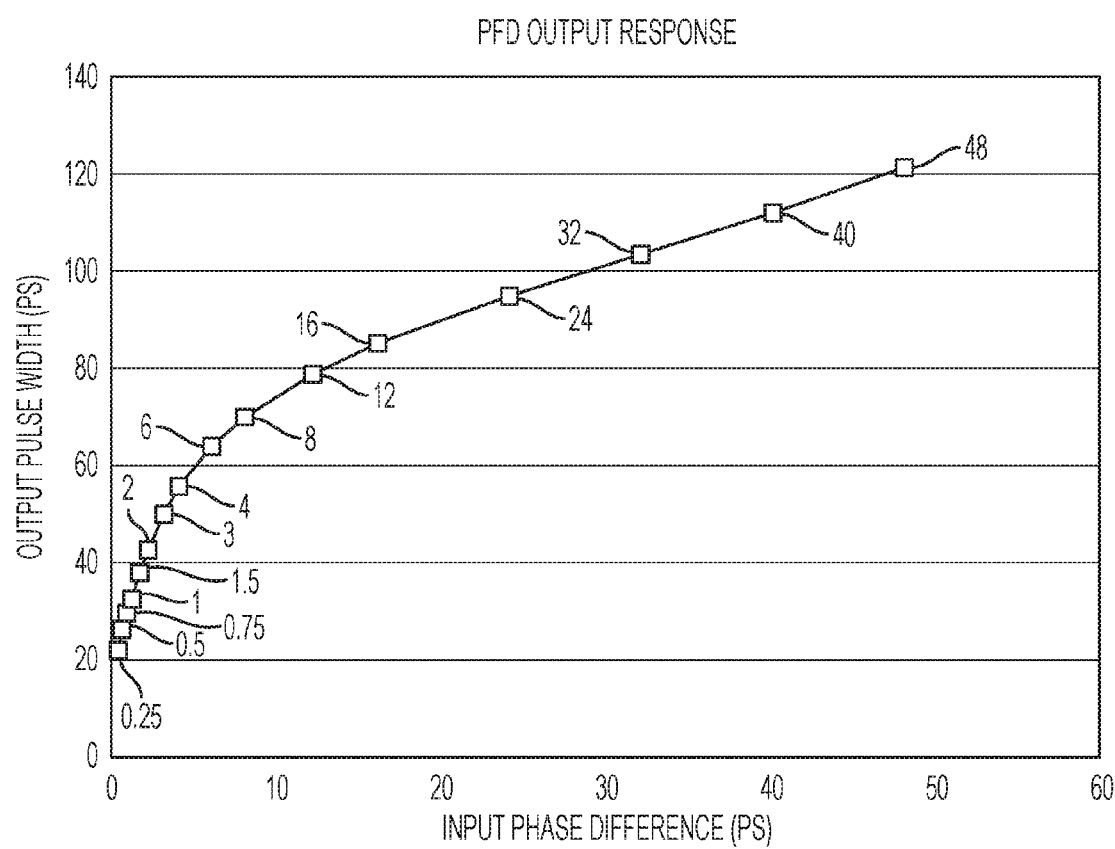
FIG. 19 graphically depicts the output response of the PFD of FIG. 12 according to one or more embodiments shown and described herein.

Referring collectively to FIGS. 12 and 19, the PFD 600 was evaluated to determine pulse width response to input phase difference. The output response of the PFD 600 (FIG. 12) is provided graphically in FIG. 19, where the input phase difference of the signals input to the reference signal input 102 and the clock signal input 104 is plotted on the horizontal axis and the pulse width of the corresponding output signal is plotted on the vertical axis. Both the horizontal axis and the vertical axis have units of picoseconds. The PFD 600 output pulse widths having longer duration than the input phase difference. The output response of the PFD 600 generated a linear curve for input phase differences above 7 picoseconds, i.e., an increase in the input phase difference resulted in a substantially equal change in the output pulse width. For input phase differences below 7 picoseconds, the pulse width of output by the PFD 600 exponentially approached zero.

Further analysis of the PFD 600 was performed to determine power consumption. Due to the relatively large number of transistors utilized by the PFD 600, more power was consumed compared to standard designs. In an experiment where signals were input to the reference signal input 102 and the clock signal input 104 at a frequency of 125 MHz in 1.2 volts 90 nm CMOS, the PFD 600 consumed 26.9 μW of power. The power consumed by PFD 600 was larger than the 9.05 μW of power consumed by a standard design. Considering the performance benefits of the PFD 600, the increased power consumption of the PFD 600 fell within an acceptable range for typical applications.

It should now be understood that the embodiments described herein relate to PFD with high resolution, dead zone elimination, wide input range, a balanced up signal and down signal outputs, and a linear output pulse width response, and a high operating frequency. The embodiments described herein achieve a high degree of accuracy and minimize the detection dead zone for small phase differences as low as 750 femtoseconds for all process corners for the 90 nm technology. The embodiments described herein can perform with high input range, which can eliminate any practical input frequency mismatch for input signals operating at less than about 2 GHz. Moreover, the PFD's described herein avoid simultaneous "up" and "down" output pulses. The embodiments described herein are implemented only using static digital logic and avoid all disadvantages associated with pass transistor logic. Thus, embodiments of the present disclosure can be utilized for a variety of applications including, but not limited to, high-accuracy, high-speed, and fast-converging phase locked loop applications.

For the purpose of defining and describing the present disclosure, it is noted that the term "dead zone" is a measure of the minimal length of time the phase difference can occur above which a PFD design can correctly detect. It is also noted that the term "narrow" or "short" in reference to a pulse or signal signifies that the pulse or signal remains in a logical state (i.e., logical one or logical zero) of sufficient duration of time to activate the logic device.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter.

Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A phase frequency detector comprising a reference signal input, a clock signal input, an up signal output, a down signal output, a first D flip-flop, a second D flip-flop, a third D flip-flop, and a fourth D flip-flop, wherein:
   each of the first D flip-flop, the second D flip-flop, the third D flip-flop, and the fourth D flip-flop comprises a D input, a clock input, an active-low reset input, and a Q output;
   the Q output of the first D flip-flop is connected to the up signal output;
   the Q output of the second D flip-flop is connected to the down signal output;
   the reference signal input is connected to the clock input of the third D flip-flop;
   the clock signal input is connected to the clock input of the fourth D flip-flop;
   the Q output of the third D flip-flop is connected to the clock input of the first D flip-flop and the active-low reset input of the second D flip-flop;
   the Q output of the fourth D flip-flop is connected to the clock input of the second D flip-flop and the active-low reset input of the first D flip-flop;
   the third D flip-flop outputs a reference pulse on the Q output of the third D flip-flop in response to a reference signal provided by the reference signal input; and
   the fourth D flip-flop outputs a clock pulse on the Q output of the fourth D flip-flop in response to a clock signal provided by the clock signal input.

2. The phase frequency detector of claim 1, wherein a logical high signal is applied to the D input of each of the first D flip-flop, the second D flip-flop, the third D flip-flop, and the fourth D flip-flop.

3. The phase frequency detector of claim 1, wherein:
   the phase frequency detector comprises a first delay buffer and a second delay buffer;
   the reference signal input is connected to the first delay buffer;
   the first delay buffer is connected to the active-low reset input of the third D flip-flop;
   the clock signal input is connected to the second delay buffer; and
   the second delay buffer is connected to the active-low reset input of the fourth D flip-flop.

4. The phase frequency detector of claim 3, wherein:
   the phase frequency detector comprises a first inverter and a second inverter;
   the first inverter and the second inverter each comprise and input and an output;
   each of the first D flip-flop, the second D flip-flop, the third D flip-flop, and the fourth D flip-flop comprises an active-low clock input;
   the Q output of the third D flip-flop is connected to the input of the first inverter;
   the output of the first inverter is connected to the active-low clock input of the first D flip-flop;
   the Q output of the fourth D flip-flop is connected to the input of the second inverter; and
   the output of the second inverter is connected to the active-low clock input of the second D flip-flop.

5. The phase frequency detector of claim 4, wherein:
   the phase frequency detector comprises a third inverter and a fourth inverter;
   the third inverter and the fourth inverter each comprise an input and an output;
   the reference signal input is connected to the input of the third inverter;
   the output of the third inverter is connected to the active-low clock input of the third D flip-flop;
   the clock signal input is connected to the input of the fourth inverter; and
   the output of the fourth inverter is connected to the active-low clock input of the fourth D flip-flop.

6. The phase frequency detector of claim 5, wherein:
   the phase frequency detector comprises a fifth inverter and a sixth inverter;
   the fifth inverter and the sixth inverter each comprise an input and an output;
   the Q output of the third D flip-flop is connected to the input of the sixth inverter;
   the output of the sixth inverter is connected to the active-low reset input of the second D flip-flop;
   the Q output of the fourth D flip-flop is connected to the input of the fifth inverter; and
   the output of the fifth inverter is connected to the active-low reset input of the first D flip-flop.

7. The phase frequency detector of claim 5, wherein:
   the phase frequency detector comprises a first NOR gate, a second NOR gate, a first intra-stage feedback path, and a second intra-stage feedback path;
   the first intra-stage feedback path is the connection of the Q output of the first D flip-flop to an input of the first NOR gate and the second NOR gate;
   the Q output of the fourth D flip-flop is connected to the input of the first NOR gate;
   output of the first NOR gate is connected to the D input of the first D flip-flop;
   the second intra-stage feedback path is the connection of the Q output of the second D flip-flop to the input of the first NOR gate and the second NOR gate;
   the Q output of the third D flip-flop is connected to the input of the second NOR gate; and
   output of the second NOR gate is connected to the D input of the second D flip-flop.

8. The phase frequency detector of claim 7, wherein a logical high signal is applied to the D input of each of the third D flip-flop and the fourth D flip-flop.

9. The phase frequency detector of claim 7, wherein:
   the phase frequency detector comprises a third NOR gate and a fourth NOR gate;
   the Q output of the fourth D flip-flop and either a ground or a common reference voltage are connected to the input of the third NOR gate;
   the output of the third NOR gate is connected to the active-low reset input of the first D flip-flop;
   the Q output of the third D flip-flop and either the ground or the common reference voltage are connected to the input of the fourth NOR gate; and
   the output of the fourth NOR gate is connected to the active-low reset input of the second D flip-flop.

10. The phase frequency detector of claim 9, wherein a logical high signal is applied to the D input of each of the third D flip-flop and the fourth D flip-flop.

11. The phase frequency detector of claim 9, wherein:
the phase frequency detector comprises a seventh inverter, an eighth inverter, a ninth inverter, a tenth inverter, a first inter-stage feedback path, and a second inter-stage feedback path;
the Q output of the first D flip-flop is connected to an input of the seventh inverter;
an output of the seventh inverter is connected to an input of the eighth inverter;
an output of the eighth inverter is connected to the up signal output;
the first inter-stage feedback path connects the output of the seventh inverter and the D input of the third D flip-flop;
the Q output of the second D flip-flop is connected to an input of the ninth inverter;
an output of the ninth inverter is connected to an input of the tenth inverter;
an output of the tenth inverter is connected to the down signal output; and
the second inter-stage feedback path connects the output of the ninth inverter and the D input of the fourth D flip-flop.

12. The phase frequency detector of claim 11, wherein:
the first inter-stage feedback path comprises a first feedback inverter and a second feedback inverter; and
the second inter-stage feedback path comprises a third feedback inverter and a fourth feedback inverter.

13. The phase frequency detector of claim 12, wherein:
the output of the seventh inverter is connected to an input of the first feedback inverter; and
an output of the first feedback inverter is connected to an input of the second feedback inverter;
an output of the second feedback inverter is connected to the D input of the third D flip-flop;
the output of the ninth inverter is connected to an input of the third feedback inverter;
an output of the third feedback inverter is connected to an input of the fourth feedback inverter; and
an output of the fourth feedback inverter is connected to the D input of the fourth D flip-flop.

14. The phase frequency detector of claim 13, wherein each of the first feedback inverter, the second feedback inverter, the third feedback inverter, and the fourth feedback inverter is a high-skew inverter.

15. The phase frequency detector of claim 1, wherein:
the reference signal comprises a reference rising edge;
the clock signal comprises a clock rising edge;
the clock rising edge leads the reference rising edge by greater than or equal to about 750 femtoseconds;
a down signal is generated on the down signal output; and
the down signal comprises a pulse corresponding to the clock rising edge that persists until the reference rising edge.

16. The phase frequency detector of claim 1, wherein:
the reference signal comprises a reference rising edge;
the clock signal comprises a clock rising edge;
the reference rising edge leads the clock rising edge by greater than or equal to about 750 femtoseconds;
an up signal is generated on the up signal output; and
the up signal comprises a pulse corresponding to the reference rising edge that persists until the clock rising edge.

17. The phase frequency detector of claim 1, wherein:
the reference signal has a reference frequency and comprises a reference rising edge;
the clock signal has a clock frequency and comprises a clock rising edge;
the reference frequency is at least about double the clock frequency;
when the reference signal is input to the reference signal input and the clock signal is input to the clock signal input, an up signal is generated on the up signal output; and
the up signal comprises a pulse corresponding to the reference rising edge that persists until the clock rising edge.

18. The phase frequency detector of claim 17, wherein the reference frequency or the clock frequency is less than or equal to about 2 GHz.

19. A fast converging phase frequency detector comprising a reference signal input, a clock signal input, an up signal output, a down signal output, a first D flip-flop, a second D flip-flop, a third D flip-flop, a fourth D flip-flop a first inverter, a second inverter, a third inverter, a fourth inverter, a seventh inverter, an eighth inverter, a ninth inverter, a tenth inverter, a first delay buffer, a second delay buffer, a first NOR gate, a second NOR gate, a third NOR gate, a fourth NOR gate, a first intra-stage feedback path, a second intra-stage feedback path, a first inter-stage feedback path, and a second inter-stage feedback path, wherein:
each of the first D flip-flop, the second D flip-flop, the third D flip-flop, and the fourth D flip-flop comprises a D input, a clock input, an active-low reset input, an active-low clock input, and a Q output;
the Q output of the first D flip-flop is connected to the up signal output;
the Q output of the second D flip-flop is connected to the down signal output;
the reference signal input is connected to the clock input of the third D flip-flop;
the clock signal input is connected to the clock input of the fourth D flip-flop;
the Q output of the third D flip-flop is connected to the clock input of the first D flip-flop and the active-low reset input of the second D flip-flop;
the Q output of the fourth D flip-flop is connected to the clock input of the second D flip-flop and the active-low reset input of the first D flip-flop;
the third D flip-flop outputs a reference pulse on the Q output of the third D flip-flop in response to a reference signal provided by the reference signal input;
the fourth D flip-flop outputs a clock pulse on the Q output of the fourth D flip-flop in response to a clock signal provided by the clock signal input;
the reference signal input is connected to an input of the first delay buffer;
an output of the first delay buffer is connected to the active-low reset input of the third D flip-flop;
the reference signal input is connected to an input of the third inverter;
an output of the third inverter is connected to the active-low clock input of the third D flip-flop;
the clock signal input is connected to an input of the second delay buffer;
an output of the second delay buffer is connected to the active-low reset input of the fourth D flip-flop;
the clock signal input is connected to an input of the fourth inverter;
an output of the fourth inverter is connected to the active-low clock input of the fourth D flip-flop;
the Q output of the third D flip-flop is connected to an input of the first inverter;

an output of the first inverter is connected to the active-low clock input of the first D flip-flop;
the Q output of the fourth D flip-flop is connected to an input of the second inverter;
an output of the second inverter is connected to the active-low clock input of the second D flip-flop;
the first intra-stage feedback path is the connection of the Q output of the first D flip-flop to an input of the first NOR gate and the second NOR gate;
the Q output of the fourth D flip-flop is connected to the input of the first NOR gate;
an output of the first NOR gate is connected to the D input of the first D flip-flop;
the second intra-stage feedback path is the connection of the Q output of the second D flip-flop to an input of the first NOR gate and the second NOR gate;
the Q output of the third D flip-flop is connected to the input of the second NOR gate;
an output of the second NOR gate is connected to the D input of the second D flip-flop;
the Q output of the fourth D flip-flop and either a ground or a common reference voltage are connected to the input of the third NOR gate;
the output of the third NOR gate is connected to the active-low reset input of the first D flip-flop;
the Q output of the third D flip-flop and either the ground or the common reference voltage are connected to an input of the fourth NOR gate;
an output of the fourth NOR gate is connected to the active-low reset input of the second D flip-flop;
the Q output of the first D flip-flop is connected to an input of the seventh inverter;
an output of the seventh inverter is connected to an input of the eighth inverter;
an output of the eighth inverter is connected to the up signal output;
the Q output of the second D flip-flop is connected to an input of the ninth inverter;
an output of the ninth inverter is connected to an input of the tenth inverter;
an output of the tenth inverter is connected to the down signal output;
the first inter-stage feedback path comprises a first feedback inverter and a second feedback inverter;
the second inter-stage feedback path comprises a third feedback inverter and a fourth feedback inverter;
an output of the seventh inverter is connected to an input of the first feedback inverter;
an output of the first feedback inverter is connected to an input of the second feedback inverter;
an output of the second feedback inverter is connected to the D input of the third D flip-flop;
an output of the ninth inverter is connected to an input of the third feedback inverter;
an output of the third feedback inverter is connected to an input of the fourth feedback inverter; and
an output of the fourth feedback inverter is connected to the D input of the fourth D flip-flop.

20. A phase lock loop control system comprising, a signal input, a signal output, a phase frequency detector, a charge pump and low-pass filter circuit, a variable-controlled oscillator, a frequency divider, and a feedback path, wherein:
the phase frequency detector comprises a reference signal input, a clock signal input, a first D flip-flop, a second D flip-flop, a third D flip-flop, a fourth D flip-flop and a phase frequency detector output comprising an up signal output and a down signal output, wherein:
each of the first D flip-flop, the second D flip-flop, the third D flip-flop, and the fourth D flip-flop comprises a D input, a clock input, an active-low reset input, and a Q output,
the Q output of the first D flip-flop is connected to the up signal output,
the Q output of the second D flip-flop is connected to the down signal output,
the reference signal input is connected to the clock input of the third D flip-flop,
the clock signal input is connected to the clock input of the fourth D flip-flop,
the Q output of the third D flip-flop is connected to the clock input of the first D flip-flop and the active-low reset input of the second D flip-flop,
the Q output of the fourth D flip-flop is connected to the clock input of the second D flip-flop and the active-low reset input of the first D flip-flop,
the third D flip-flop outputs a reference pulse on the Q output of the third D flip-flop in response to a reference signal provided by the reference signal input, and
the fourth D flip-flop outputs a clock pulse on the Q output of the fourth D flip-flop in response to a clock signal provided by the clock input;
the charge pump and low-pass filter circuit comprises a charge input and a charge output;
the variable-controlled oscillator comprises a voltage input and a voltage output;
the signal input is connected to the reference signal input of the phase frequency detector;
the phase frequency detector output is connected to the charge input of the charge pump & low-pass filter circuit;
the charge output of the charge pump & low-pass filter circuit is connected to the voltage input of the variable-controlled oscillator;
the voltage output of the variable-controlled oscillator is connected to the signal output and the feedback path;
the feedback path comprises the frequency divider; and
the feedback path is connected to the clock signal input of the phase frequency detector.

* * * * *

UNITED STATES PATENT AND TRADEMARK OFFICE
CERTIFICATE OF CORRECTION

PATENT NO. : 9,647,671 B2
APPLICATION NO. : 14/987171
DATED : May 9, 2017
INVENTOR(S) : Joseph Strzelecki et al.

It is certified that error appears in the above-identified patent and that said Letters Patent is hereby corrected as shown below:

In the Specification

Column 1, Lines 49-50:
"connected to the clock input of the first D flip-flop. The active-low reset input of the second D flip-flop. The Q output"
Should read:
--connected to the clock input of the first D flip-flop and the active-low reset input of the second D flip-flop. The Q output--;

Column 1, Line 63:
"D flip-flop a first inverter, a second inverter, a third inverter,"
Should read:
--D flip-flop, a first inverter, a second inverter, a third inverter,--;

Column 2, Lines 58-59:
"output of seventh inverter is connected to the input of the eighth inverter. The output of eighth inverter is connected to"
Should read:
--output of the seventh inverter is connected to the input of the eighth inverter. The output of the eighth inverter is connected to--;

Column 2, Lines 61-63:
"is connected to the input of ninth inverter and the output of ninth inverter is connected to the input of tenth inverter. The output of tenth inverter is connected to the down signal"
Should read:
--is connected to the input of the ninth inverter and the output of the ninth inverter is connected to the input of the tenth inverter. The output of the tenth inverter is connected to the down signal--;

Signed and Sealed this
Sixth Day of February, 2018

Joseph Matal
*Performing the Functions and Duties of the
Under Secretary of Commerce for Intellectual Property and
Director of the United States Patent and Trademark Office*

Column 3, Line 43:
"is connected to the charge input of the charge pump &"
Should read:
--is connected to the charge input of the charge pump and--;

Column 3, Line 45:
"& low-pass filter circuit is connected to the voltage input of"
Should read:
--and low-pass filter circuit is connected to the voltage input of--;

Column 5, Line 45:
"object, which includes objects that are directly connected"
Should read:
--object, which includes objects that are directly connected to--;

Column 13, Line 65:
"prises the PFD 600 as shown in FIG. 12, a charge pump &"
Should read:
--prises the PFD 600 as shown in FIG. 12, a charge pump and--;

Column 14, Line 4:
"signal output 112. The charge pump & low-pass filter circuit"
Should read:
--signal output 112. The charge pump and low-pass filter circuit--;

Column 14, Lines 10-11:
"to the circuit input 712 of the charge pump & low-pass filter circuit 702. The circuit output 714 of the charge pump &"
Should read:
--to the circuit input 712 of the charge pump and low-pass filter circuit 702. The circuit output 714 of the charge pump and--;

Column 15, Line 64:
"622 can be sized provide the necessary current to drive"
Should read:
--622 can be sized to provide the necessary current to drive--;

Column 16, Line 39:
"ating at less than about 2 GHz. Moreover, the PFD's"
Should read:
--ating at less than about 2 GHz. Moreover, the PFDs--;

In the Claims

Column 22, Claim 20, Line 45:
"charge input of the charge pump & low-pass filter"
Should read:
--charge input of the charge pump and low-pass filter--; and Column 22, Claim 20, Line 47:
"the charge output of the charge pump & low-pass filter"
Should read:
--the charge output of the charge pump and low-pass filter--.